United States Patent
Pappas et al.

(10) Patent No.: US 12,514,136 B2
(45) Date of Patent: Dec. 30, 2025

(54) VOLTAGE-ASSISTED ANNEALING TO ALTER TUNNEL JUNCTION PROPERTIES

(71) Applicant: Rigetti & Co, LLC, Berkeley, CA (US)

(72) Inventors: David Pappas, Boulder, CO (US); Mark Field, Campbell, CA (US); Eyob A. Sete, Walnut Creek, CA (US); Joshua Yousouf Mutus, Kelowna (CA); Xiqiao Wang, Fremont, CA (US)

(73) Assignee: Rigetti & Co, LLC, Berkeley, CA (US)

( * ) Notice: Subject to any disclaimer, the term of this patent is extended or adjusted under 35 U.S.C. 154(b) by 0 days.

(21) Appl. No.: 19/045,111

(22) Filed: Feb. 4, 2025

(65) Prior Publication Data

US 2025/0204275 A1 Jun. 19, 2025

Related U.S. Application Data

(63) Continuation of application No. PCT/US2024/061058, filed on Dec. 19, 2024.

(60) Provisional application No. 63/612,176, filed on Dec. 19, 2023, provisional application No. 63/636,227, filed on Apr. 19, 2024.

(51) Int. Cl.
*H10N 60/01* (2023.01)
*H10N 60/12* (2023.01)
*H10N 69/00* (2023.01)

(52) U.S. Cl.
CPC ......... *H10N 60/0912* (2023.02); *H10N 60/12* (2023.02); *H10N 69/00* (2023.02)

(58) Field of Classification Search
CPC .......................... H10N 60/0912; H10N 60/12
See application file for complete search history.

(56) References Cited

U.S. PATENT DOCUMENTS

| | | | |
|---|---|---|---|
| 5,629,922 A | 5/1997 | Moodera et al. | |
| 6,217,672 B1 | 4/2001 | Zhang | |
| 9,966,524 B2 | 5/2018 | Yamamoto et al. | |
| 10,170,681 B1 | 1/2019 | Rosenblatt et al. | |
| 10,418,540 B2 | 9/2019 | Orcutt et al. | |
| 2018/0108410 A1 | 4/2018 | Whitaker et al. | |
| 2021/0350266 A1* | 11/2021 | Hassel | G01R 33/0354 |
| 2022/0094358 A1* | 3/2022 | Phung | H10N 69/00 |
| 2022/0140221 A1 | 5/2022 | Schuster et al. | |

OTHER PUBLICATIONS

Zeng, et al., "Atomic structure and oxygen deficiency of the ultrathin aluminium oxide barrier in Al/AlOx/Al Josephson junctions", Scientific Reports 6, 29679, 2016, 8 pages.
(Continued)

*Primary Examiner* — Paul A Wartalowicz
(74) *Attorney, Agent, or Firm* — Henry Patent Law Firm PLLC

(57) ABSTRACT

In a general aspect, junction properties of tunnel junctions are altered by voltage-assisted annealing processes. In some cases, a method includes obtaining a circuit comprising a tunnel junction, modifying a junction resistance of the tunnel junction by applying a voltage across the tunnel junction, and obtaining a measured value of the junction resistance. The tunnel junction may include a metal and a metal oxide.

16 Claims, 29 Drawing Sheets

(56) References Cited

OTHER PUBLICATIONS

Zhu, et al., "Magnetic tunnel junctions", Materials Today 9, 36, 2006, 10 pages.

Žurauskiene, et al., "Magnetoresistance relaxation in thin la-sr-mn-o films exposed to high-pulsed magnetic fields", IEEE Transactions on Plasma Science 41, 2830, 2013, 6 pages.

WIPO, Invitation to Pay Additional Fees and, Where Applicable, Protest Fee issued in Appl No. PCT/US2024/061058 on Jan. 30, 2025, 2 pages, 2 pages.

Alfonzetti, et al., "Simulated Annealing With Restarts for the Optimization of Electromagnetic Devices", IEEE Transactions on Magnetics 42, 1115-1118, 2006, 4 pages.

Ambegaokar, et al., "Tunneling Between Superconductors", Phys. Rev. Lett. 10, 486, Jun. 1, 1963, 5 pages.

Bilmes, et al., "In-situ bandaged josephson junctions for superconducting quantum processors", Superconductor Science and Technology 34, 125011, 2021, 5 pages.

Bilmes, et al., "Probing defect densities at the edges and inside josephson junctions of superconducting qubits", npj Quantum Information 8,10.1038/s41534-022-00532-4, 2019, 6 pages.

Bouchet, et al., "Experimental study of ELNESat grain boundaries in alumina: intergranular radiation damage effects on Al-L23 and O-K edges", Ultramicroscopy 96, 139-152, 2023, 14 pages.

Cabrera, et al., "Theory of the oxidation of metals", Rep. Prog. Phys. 12 163, 1949, 23 pages.

Cai, et al., "Temperature and pressure dependent Mott potentials and their influence on self-limiting oxide film growth", Applied Physics Letters 101, 171605, https://pubs.aip.org/aip/apl/articlepdf/doi/10.1063/1.4764552/14257769/171605, 2012, 4 pages.

Castellanos-Beltran, et al., "Bandwidth and Dynamic Range of a Widely Tunable Josephson Parametric Amplifier", IEEE Transactions on Applied Superconductivity 19, 944, 2009, 4 pages.

Clarke, J, "The SQUID handbook vol. 1 Fundamentals and technology of SQUIDs and SQUID systems", Wiley VCH, Germany, 2004, 405 pages.

Clarke, et al., "The SQUID handbook vol. 1 Fundamentals and technology of SQUIDs and SQUID systems", Wiley VCH, Germany, 2004, 414 pages.

Cyster, et al., "Simulating the fabrication of aluminium oxide tunnel junctions", npj Quantum Information 7, 12, 2021, 12 pages.

Debenedetti, et al., "Supercooled liquids and the glass transition", Nature 410, 259-267, 2001, 9 pages.

Devoret, Michelh. , "Quantum fluctuations in electrical circuits", Edition de Physique, France, 1997, 34 pages.

Fontanini, et al., "Interplay between charge trapping and polarization switching in beol-compatible bilayer ferroelectric tunnel junctions", IEEE Journal of the Electron Devices Society 10, 1, 2022, 7 pages.

Fritz, et al., "Correlating the nanostructure of Al-oxide with deposition conditions and dielectric contributions of twolevel systems in perspective of superconducting quantum circuits", Scientific Reports 8, 10.1038/s41598-018-26066-4, 2018, 11 pages.

Fritz, et al., "Structural and nanochemical properties of alox layers in al/alox/al-layer systems for josephson junctions", Physical Review Materials 3, 10.1103/physrevmaterials.3.114805, 2019, 11 pages.

Granata, et al., "Localized laser trimming of critical current in niobium based josephson devices", Applied Physics Letters 90, 10.1063/1.2746060, 2007, 3 pages.

Hashimoto, et al., "Structure of alumina glass", Scientific Reports 12, 516, 2022, 9 pages.

Josephson, B, "Possible new effects in superconductive tunnelling", Physics Letters 1, 251, 1962, 3 pages.

Kim, et al., "A density-functional theory study of the Al/AlOx/Al tunnel junction", Journal of Applied Physics 128, 155102 https://pubs.aip.org/aip/jap/articlepdf/doi/10.1063/5.0020292/14113892/155102, 2010, 14 pages.

Kimoto, et al., "Coordination and interface analysis of atomic-layer-deposition Al2O3 on Si(001) using energy-loss near-edge structures", Applied Physics Letters 83, 4306, 2003, 3 pages.

Kleinsasser, et al., "Dependence of Critical Current Density on Oxygen Exposure in Nb-AlOx-Nb Tunnel Junctions", IEEE Transactions on Applied Superconductivity 5, 26, 1995, 5 pages.

Koch, et al., "Charge-insensitive qubit design derived from the Cooper pair box", Phys. Rev. A 76, 042319, Oct. 12, 2007, 19 pages.

Konkin, et al., "Annealing effects in tunnel Junctions (voltage annealing with alternating polarity)", Journal of Applied Physics 53, 5057, https://pubs.aip.org/aip/jap/articlepdf/53/7/5057/18397790/5057, 1982, 4 pages.

Konkin, et al., "Annealing effects in tunnel junctions (voltage annealing)", Journal of Applied Physics 51, 5450, https://pubs.aip.org/aip/jap/articlepdf/51/10/5450/7969138/5450, 1980, 5 pages.

Lecocq, et al., "Junction fabrication by shadow evaporation without a suspended bridge", Nanotechnology 22, 315302, 2011, 5 pages.

Li, et al., "Harnessing dislocation motion using an electric field", Nature Materials 22, 958-963, 2023, 17 pages.

Likharev, et al., "Rsfq logic/memory family: a new josephson-junction technology for sub-terahertz-clockfrequency digital systems", IEEE Transactions on Applied Superconductivity 1, 3, 1991, 26 pages.

Lisenfeld, et al., "Electric field spectroscopy of material defects in transmon qubits", npj Quantum Information 5, 10.1038/s41534-019-0224-1, 2019, 6 pages.

Macklin, et al., "A near—quantum-limited josephson traveling wave parametric amplifier", Science 350, 307, https://www.science.org/doi/pdf/10.1126/science.aaa8525, 2015, 4 pages.

Manenti, et al., "Full control of superconducting qubits with combined on-chip microwave and flux lines", Applied Physics Letters 119, 144001, https://pubs.aip.org/aip/apl/articlepdf/doi/10.1063/5.0065517/13194475/144001, 2021, 5 pages.

Martinis, et al., "Decoherence in josephson qubits from dielectric loss", Phys. Rev. Lett. 95, 210503, 2005, 4 pages.

Migacz, et al., "Thermal Annealing of Nb/Al-AlOx/Nb Josephson Junctions", IEEE Transactions on Applied Superconductivity, vol. 13, Issue: 2, Jun. 30, 2003, 4 pages.

Muthusubramanian, et al., "Wafer-scale uniformity of dolan-bridge and bridgeless manhattan-style josephson junctions for superconducting quantum processors", Quantum Science and Technology 10.1088/2058-9565/ad199c, 2023, 11 pages.

Nair, et al., "Cycling Waveform Dependent Wake-Up and ON/OFF Ratio in Al2O3/Hf0.5Zr0.502 Ferroelectric Tunnel Junction Devices", ACS Applied Electronic Materials 5, 1478, 2023, 11 pages.

Nakamura, et al., "Coherent control of macroscopic quantum states in a single-cooper-pair box", Nature 398, 786, 1999, 3 pages.

Nersisyan, et al., "Manufacturing low dissipation superconducting quantum processors", arXiv:1901.08042 [quant-ph], 2019, 4 pages.

Nesbitt, et al., "Time-dependent glassy behavior of interface states in Al-AlOx-Al tunnel junctions", Phys. Rev. B 75, 195441, May 30, 2007, 8 pages.

O'Dwyer, "Current-Voltage Characteristics of Dielectric Films", Journal of Applied Physics 37, 599, https://pubs.aip.org/aip/jap/articlepdf/37/2/599/7938519/599, 2004, 3 pages.

Oh, et al., "Correlating aluminum layer deposition rates, josephson junction microstructure and superconducting qubits' performance", submitted to Acta Materialia, 2024, 11 pages.

Pauling, Linus, "The nature of the chemical bond. application of results obtained from the quantum mechanics and from a theory of paramagnetic susceptibility to the structure of molecules", Journal of the American Chemical Society 53, 1367-1400, 1931, 34 pages.

Rippard, et al., "Ultrathin aluminum oxide tunnel barriers", Phys. Rev. Lett. 88, 046805, 2002, 4 pages.

Schafer, et al., "Annealing effects and oxide structure in alumina tunnelling barriers", J. Phys.: Condens. Matter 3 2907, 1991, 10 pages.

Schlör, et al., "Correlating Decoherence in Transmon Qubits: Low Frequency Noise by Single Fluctuators", Phys. Rev. Lett. 123, 190502, 2019, 6 pages.

Valles-Sanclemente, et al., "Post-fabrication frequency trimming of coplanar-waveguide resonators in circuit QED quantum processors", Applied Physics Letters 123, 034004, https://pubs.aip.org/aip/apl/articlepdf/doi/10.1063/5.0148222/18051172/034004 1 5.0148222, 2023, 5 pages.

(56) References Cited

OTHER PUBLICATIONS

Van Duzer, et al., "Principles of Superconductive Devices and Circuits, 2nd ed.", Prentice-Hall, Upper Saddle River NJ, 1999, Chapter 4, pp. 139-143, 3 pages.
Vettoliere, et al., "Fine optimization of josephson critical current in squid devices by thermal annealing", Journal of Physics: Conference Series 1559, 012014, 2020, 7 pages.
Wang, et al., "Surface participation and dielectric loss in superconducting qubits", Appl. Phys. Lett. 107, 162601, 2015, 5 pages.
Weigel, et al., "High-resolution al I2, 3-edge x-ray absorption near edge structure spectra of al-containing crystals and glasses: coordination number and bonding information from edge components", Journal of Physics: Condensed Matter 20, 135219, 2008, 9 pages.
Arute, Frank, et al., "Quantum supremacy using a programmable superconducting processor", Nature vol. 574, pp. 505-510 (2019), Oct. 23, 2019, 7 pages.
Balaji, Yashwanth, et al., "Electron-beam annealing of Josephson junctions for frequency tuning of quantum processors", arXiv:2401.07415 [physics.app-ph], Aug. 16, 2024, 11 pages.
Ebinger, H D, et al., "Electron-impact-induced oxidation of Al(111) in water vapor: relation to Cabrera-Mott mechanism", physical review B, vol. 57, No. 3, Jan. 15, 1998, Jan. 15, 1998, 9 pages.
Zhang, Eric J, et al., "High-performance superconducting quantum processors via laser annealing of transmon qubits", Sci. Adv. 8, eabi6690 (2022), May 13, 2022, 8 pages.
Field, Mark, et al., "Modular Superconducting Qubit Architecture with a Multi-chip Tunable Coupler", arXiv:2308.09240 [quant-ph], Mar. 2, 2024, 9 pages.
Fowler, Austin G, et al., "High threshold universal quantum computation on the surface code", arXiv:0803.0272 [quant-ph], Dec. 16, 2012, 18 pages.
Gold, Alysson, et al., "Entanglement Across Separate Silicon Dies in a Modular Superconducting Qubit Device", arXiv:2102.13293 [quant-ph], Mar. 11, 2021, 9 pages.
Granata, et al., "Trimming of Critical Current in Niobium Josephson Devices by Laser Annealing", Journal of Physics: Conference Series 97 (2008) 012110, 2008, 8 pages.
Hashimoto, Hideki, et al., "Structure of alumina glass", Scientific Reports vol. 12, Article No. 516 (2022), Jan. 11, 2022, 9 pages.
Hertzberg, Jared B, et al., "Laser-annealing Josephson junctions for yielding scaled-up superconducting quantum processors", npj quantum information, 7:129, Aug. 19, 2021, 8 pages.
Hertzberg, Jared B, et al., "Laser-annealing Josephson junctions for yielding scaled-up superconducting quantum processors.", arXiv:2009.00781 [quant-ph], Sep. 23, 2020, 16 pages.
Jeurgens, et al., "Growth kinetics and mechanisms of aluminum-oxide films formed by thermal oxidation of aluminum", Journal of Applied Physics, vol. 92, Issue 3, p. 1649-1656, Aug. 1, 2002, 9 pages.
Kim, Hyunseong, et al., "Effects of Laser-Annealing on Fixed-Frequency Superconducting Qubits", arXiv:2206.03099 [quant-ph], Jun. 7, 2022, 11 pages.
Kim, Hwang-Pill, et al., "Thermal stability studies of alternating current poled Pb(Mg1/3Nb2/3)O3-PbTiO3 single crystals grown by solid-state crystal growth", material research letters, 11:5, 383-390, Jan. 1, 2023., Jan. 1, 2023, 9 pages.
Koppinen, et al., "Complete stabilization and improvement of the characteristics of tunnel junctions by thermal annealing", arXiv:cond-mat/0611664 [cond-mat.mes-hall], Nov. 27, 2006, 4 pages.
Korshakov, Nikita D, et al., "Aluminum Josephson junction microstructure and electrical properties modification with thermal annealing", arXiv:2403.02179 [quant-ph], Mar. 4, 2024, 6 pages.
Kreikebaum, et al., "Improving wafer-scale Josephson junction resistance variation in superconducting quantum coherent circuits", 2020 Supercond. Sci. Technol. 33 06LT02, Apr. 29, 2020, 7 pages.
Magesan, Easwar, et al., "Efficient measurement of quantum gate error by interleaved randomized benchmarking", arXiv:1203.4550 [quant-ph], Mar. 19, 2014, 5 pages.
Mundada, Pranav, et al., "Suppression of Qubit Crosstalk in a Tunable Coupling Superconducting Circuit", arXiv:1810.04182 [quant-ph], May 31, 2019, 11 pages.
Osman, et al., "Simplified Josephson-junction fabrication process for reproducibly high-performance superconducting qubits", arXiv:2011.05230 [cond-mat.supr-con], Nov. 10, 2020, 6 pages.
Pappas, David P, et al., "Alternating-Bias Assisted Annealing of Amorphous Oxide Tunnel Junctions", arXiv:2401.07415 [physics.app-ph], Aug. 16, 2024, 9 pages.
Pishchimova, et al., "Improving Josephson junction reproducibility for superconducting quantum circuits: junction area fluctuation", arXiv:2210.15293 [quant-ph], Oct. 27, 2022, 9 pages.
Sete, Eyob A, et al., "Floating tunable coupler for scalable quantum computing architectures", arXiv:2103.07030v2 [quant-ph], Jun. 25, 2021, 12 pages.
Sete, Eyob A, et al., "Parametric-Resonance Entangling Gates with a Tunable Coupler", Phys. Rev. Applied 16, 024050, Aug. 27, 2021, 13 pages.
Stehlik, et al., "Tunable Coupling Architecture for Fixed-Frequency Transmon Superconducting Qubits", Aug. 20, 2021, 6 pages.
Sung, Yungkyu, et al., "Realization of High-Fidelity CZ and ZZ-Free ISWAP Gates with a Tunable Coupler", Phys. Rev. X 11, 021058, Jun. 16, 2021, 32 pages.
Wang, Xiqiao, et al., "Precision frequency tuning of tunable transmon qubits using alternating-bias assisted annealing", arXiv:2407.06425v1 [quant-ph], Jul. 8, 2024, 9 pages.
Xu, Zhijie, et al., "Metal oxidation kinetics and the transition from thin to thick films", Phys. Chem. Chem. Phys., 2012,14, 14534-14539, Sep. 25, 2012, 7 pages.
Yan, Fei, et al., "Tunable Coupling Scheme for Implementing High-Fidelity Two-Qubit Gates", Phys. Rev. Applied 10, 054062, Nov. 28, 2018, 10 pages.
Zeng, et al., "Direct observation of the thickness distribution of ultra thin AlOx barriers in Al/AlOx /Al Josephson junctions", J. Phys. D: 48, 395308, 2015, 7 pages.
Zhang, Xingfan, et al., "Atomic-scale understanding of oxidation mechanisms of materials by computational approaches: A review", Materials & Design, vol. 217, May 2022, 110605, 2022, 20 pages.
Zhang, Eric J, et al., "High-performance superconducting quantum processors via laser annealing of transmon qubits", science advances, 8, eabi6690, May 13, 2022, 8 pages.
ISA, International Search Report and Written Opinion issued in Application No. PCT/US2024/061058 on Apr. 7, 2025, 15 pages.
Lapham, et al., "Computational study of oxide stoichiometry and variability in the Al/AlOx/Al tunnel junction", Nanotechnology, 33, Apr. 7, 2022, 14 pages.
Pappas, et al., "Alternating-bias assisted annealing of amorphous oxide tunnel junctions", Communication Materials, 5 Article No. 150, Aug. 12, 2024, 7 pages,.

* cited by examiner

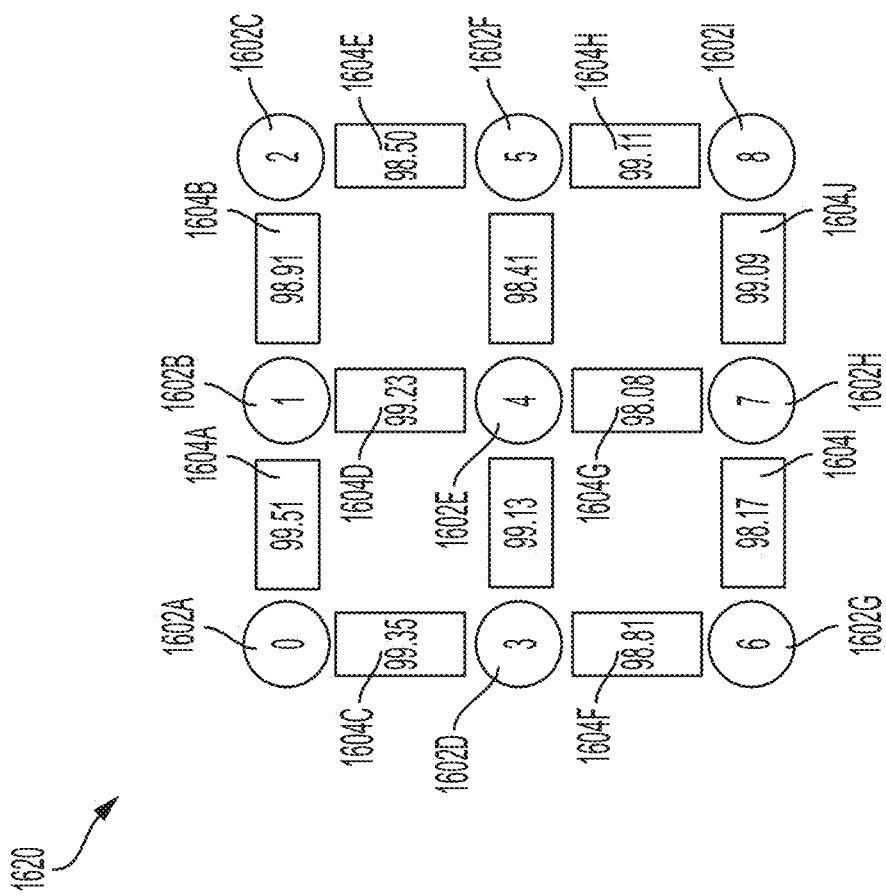

VOLTAGE-ASSISTED ANNEALING TO ALTER TUNNEL JUNCTION PROPERTIES

CROSS-REFERENCE TO RELATED APPLICATIONS

This application is a continuation of International Application PCT/US2024/061058, filed Dec. 19, 2024, which claims priority to U.S. Provisional Patent Application No. 63/636,227, filed Apr. 19, 2024, entitled "Voltage-Assisted Annealing to Alter Tunnel Junction Properties;" and U.S. Provisional Patent Application No. 63/612,176, filed Dec. 19, 2023, entitled "Voltage-Assisted Annealing to Alter Tunnel Junction Properties." The above-referenced priority documents are incorporated herein by reference in their entirety.

TECHNICAL FIELD

The following description relates voltage-assisted annealing to alter tunnel junction properties.

BACKGROUND

Tunnel junctions have been used in a wide variety of electronic and photonic devices, including tunneling diodes, Schottky diodes, transistors, Josephson junctions, qubit devices, optical devices, magnetic sensors, microwave detectors, and a variety of other devices. For example, transmon devices exploit the plasma oscillations in a tunnel junction. The frequency spectrum of a transmon device is determined in part by the supercritical current of the tunnel junction at cryogenic temperatures, and this supercritical current is related to the junction resistance of the tunnel junction at room temperature.

BRIEF DESCRIPTION OF THE DRAWINGS

FIG. 16C is a schematic diagram showing the iSWAP interleaved randomized benchmarking (iRB) fidelity between neighboring qubit devices in the quantum processor chip under the detuning conditions shown in FIG. 16B.

DETAILED DESCRIPTION

Figure 1:
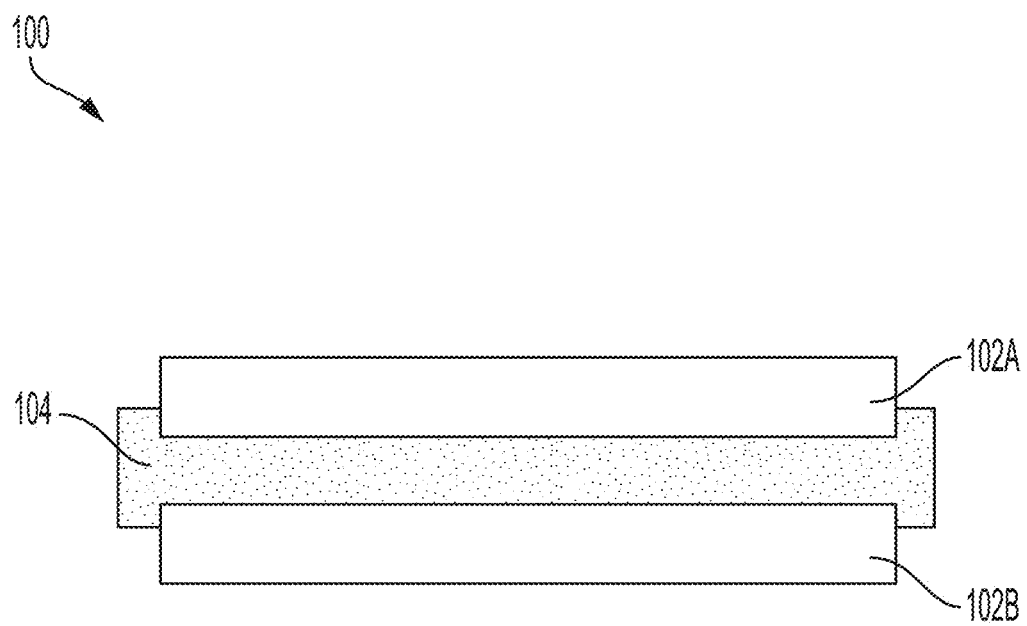
FIG. 1 is a schematic diagram showing a cross-sectional view of an example tunnel junction.

Tunnel junctions are part of a wide variety of electronic and photonic devices including tunneling diodes, Schottky diodes, transistors, Josephson junctions, transmon devices and other types of superconducting qubit devices, optical devices, magnetic sensors, microwave detectors, quantum devices, and other devices in other applications. In some aspects of what is described here, junction properties, e.g., transport, electrical, physical, and other properties, of a tunnel junction, which includes a pair of metal electrodes and a thin layer of metal oxide, can be altered by applying a voltage-assisted annealing process. For instance, the junction resistance of a tunnel junction at room temperature (e.g., 25 degrees Celsius) can be tuned by applying a voltage waveform across the tunnel junction at a target thermal annealing temperature. In some instances, the voltage-assisted "annealing" process is a controlled process to achieve desired changes in structural, physical, and chemical properties of tunnel junctions. In some instances, the voltage-assisted "annealing" process is configured to transform a tunnel junction into a stable or optimal configuration. In some instances, the voltage-assisted "annealing" process by applying a voltage waveform can alter the tunnel junction analogous to a thermal annealing process which involves controlled heating or cooling.

In some implementations, the junction resistance of the tunnel junction is not characterized or measured under the typical operating conditions of the device or system. During the voltage-assisted annealing process, the tunnel junction may be measured, characterized, or treated at room temperature or an elevated temperature (e.g., a target thermal annealing temperature) prior to being deployed in the cryogenic environment. In some instances, the junction resistance measured at the room temperature or the elevated temperature is indicative of the junction resistance or the supercritical current of the tunnel junction at a cryogenic temperature at which the tunnel junction is operated. Controlled modification of room-temperature junction resistance of a tunnel junction can result in controlled tuning of one or more parameters of a larger device that includes the tunnel junction operating in other environments (e.g., at a cryogenic temperature). For example, when a superconducting quantum circuit device of a quantum processor chip includes a tunnel junction, tuning the room-temperature junction resistance may allow the tuning of decoherence time, dephasing time, transition frequency, tunability, and other parameters of the quantum circuit device when operated in a cryogenic environment. As an example, the supercritical current of a tunnel junction in a transmon qubit device determines, at least in part, the oscillation frequencies of the transmon device. By tuning the oscillation frequencies of individual transmon qubit devices, it is possible to optimize gate fidelities and to avoid frequency collisions in large arrays of the transmon devices, allowing for systems based on these arrays to be scaled up to large numbers of qubit devices.

In some implementations, a supercritical current of a tunnel junction can be adjusted by changing the junction resistance of the thin, amorphous metal oxide layer of the tunnel junction. In some cases, properties of amorphous aluminum oxide thin film tunnel junctions are modified by a voltage-assisted annealing process. In some cases, the supercritical current, the junction resistance, or other junction properties can be modified by a voltage-assisted annealing process. For instance, a voltage waveform can be applied across the tunnel junction. In some implementations, the voltage waveform includes annealing pulses for tuning the junction properties (e.g., annealing pulses). Parameters of the annealing pulses in the voltage waveform, e.g., amplitude, polarity sequence, and duration, can be customized according to the initial properties and target properties of the tunnel junction. In some instances, the voltage waveform can be selected or constructed to achieve incrementally larger changes in junction resistance over time. In some instances, a voltage waveform can be applied to a tunnel junction at an elevated temperature, e.g., during a thermal annealing process at a target thermal annealing temperature.

In some cases, the voltage waveform also includes measurement pulses for measuring a junction resistance (e.g., measurement pluses) during the voltage-assisted annealing process; and the measured value of the junction resistance can be compared to a target value. In some implementations, a result from the comparison (e.g., a difference between the measured value and the target value) can be used to determine the parameters of the voltage waveform including the number of annealing pulses, amplitude and duration of the annealing pulses, thermal annealing temperature and environment, and other parameters in order to precisely adjust the junction resistance to the target value. In some instances, the target value may be determined by target properties of devices and systems where the tunnel junction is used, e.g., the oscillation frequency of a superconducting qubit device. For example, the target value of the junction resistance is a room-temperature junction resistance of the tunnel junction calculated based on a superconducting critical current of the tunnel junction at a cryogenic temperature according to the Ambegaokar-Baratoff formula. In some instances, the target value of the junction resistance can be determined in another manner.

In some instances, the voltage waveform can be turned off prior to the target value of the junction resistance is achieved to allow aging and stabilization of the junction resistance. In some instances, junction resistances of multiple tunnel junctions can be modified to respective target junction resistance values in parallel. Voltage waveforms having different parameters and used for the respective tunnel junctions can be customized and configured according to the respective target values of the junction resistance of the respective tunnel junctions.

In some implementations, the system and techniques disclosed here can provide technical advantages and improvements. For example, the systems and techniques described here may allow individual tuning of tunnel junctions in a device array after the tunnel junctions are fabricated. In some cases, the voltage waveform can be customized and tailored for each tunnel junction according to the initial junction properties its response to the applied voltage waveform, and the target junction properties. In some instances, the systems and techniques presented here allow easy, accurate, and targeted tuning of the junction resistances of tunnel junctions. The methods and techniques may be used to address the inherent variability in the fabrication process (e.g., variation in thickness and quality in the oxide barrier layer) and to correct fabrication errors. In some instances, the methods and systems presented here improve fabrication yield and precision of tunnel junctions and allow scaling-up of device lattices. The methods and systems presented here may be used to adjust junction resistances and supercritical currents of Josephson junctions in qubit devices of a superconducting quantum circuit in a quantum processing unit, in some cases, without affecting the couplings and anharmonicities that are set using capacitances. In some cases, the methods and systems presented here can precisely define a projected frequency spectrum of the qubit devices in a quantum processing unit, which can be used to scale the quantum processing unit up to large numbers of qubits.

In some implementations, the systems and techniques presented here can improve qubit coherence with no measurement impact on tunability; can reduce junction loss and two-level defects in tunnel junctions; can enable precise frequency tuning when targeting the designed Hamiltonians on multi-qubit quantum processor chips; and can enable high-fidelity parametric resonance two-qubit iSWAP gates. The techniques presented here can be an easy-to-implement and efficient method for precise frequency tuning and Hamiltonian targeting on scaled-up superconducting quantum processor chips. The systems and techniques presented here can improve scaling yield in a modular quantum processor architecture, and simultaneous tuning of multiple quantum circuit devices (e.g., qubit devices and coupler devices) in parallel for throughput improvement. In some cases, a combination of these and potentially other advantages and improvements may be obtained.

FIG. 1 is a schematic diagram showing aspects of an example tunnel junction 100. As shown in FIG. 1, the tunnel junction 100 includes a first electrode 102A and a second electrode 102B with a barrier layer 104 sandwiched between the first and second electrodes 102A, 102B. In some instances, the first and second electrodes 102A, 102B of the tunnel junction 100 may include a surface oxide layer caused by oxidation of the first and/or second electrodes 102A, 102B. In some instances, the example tunnel junction may be part of a fabricated circuit with two or more tunnel junctions.

In some instances, the example tunnel junction 100 shown in FIG. 1 may reside on the top surface of a substrate. In certain instances, the substrate may be an elemental semiconductor, for example silicon (Si), germanium (Ge), selenium (Se), tellurium (Te), or another elemental semiconductor. In some instances, the substrate may also include a compound semiconductor such as aluminum oxide (sapphire), silicon carbide (SiC), gallium arsenic (GaAs), indium arsenide (InAs), indium phosphide (InP), silicon germanium (SiGe), silicon germanium carbide (SiGeC), gallium arsenic phosphide (GaAsP), gallium indium phosphide (GaInP), or another compound semiconductor. In some instances, the substrate may also include a superlattice with elemental or compound semiconductor layers. In certain instances, the substrate includes an epitaxial layer. In some examples, the substrate may have an epitaxial layer overlying a bulk semiconductor or may include a semiconductor-on-insulator (SOI) structure.

The first and second electrodes 102A, 102B include superconductive materials and can be formed by patterning one or more superconductive (e.g., superconducting metal) layers or other materials on the surface of the substrate. In some implementations, each of the one or more superconductive layers include a superconducting metal, such as aluminum (Al), niobium (Nb), tantalum (Ta), titanium (Ti), vanadium (V), tungsten (W), zirconium (Zr), or another superconducting metal. In some implementations, each of the one or more superconductive layers may include a superconducting metal alloy, such as molybdenum-rhenium (Mo/Re), niobium-tin (Nb/Sn), or another superconducting metal alloy. In some implementations, each of the superconductive layers may include a superconducting compound material, including superconducting metal nitrides and superconducting metal oxides, such as titanium-nitride (TiN), niobium-nitride (NbN), zirconium-nitride (ZrN), hafnium-nitride (HfN), vanadium-nitride (VN), tantalum-nitride (TaN), molybdenum-nitride (MoN), yttrium barium copper oxide (Y—Ba—Cu—O), or another superconducting compound material. In some instances, the first and second electrodes 102A, 102B may include multilayer superconductor-insulator heterostructures.

In some implementations, the barrier layer 104 includes a thin insulating barrier typically made of a material with a high bandgap, such as aluminum oxide, magnesium oxide, tantalum oxide, or another type of metal oxide. The thickness of the barrier layer 104 is critical to the operation of the tunnel junction as it determines the probability of an electron tunneling through the barrier. In some instances, the materials used in the barrier layer 104 may be determined according to the material of the first and second electrodes 102A, 102B, the performance requirement of the tunnel junction, or other parameters. In some instances, the barrier layer 104 may be formed using thermal oxidation, plasma oxidation, electron beam deposition, sputtering, atomic layer deposition, or another process.

In some instances, the first and second electrodes 102A, 102B and the barrier layer 104 may be fabricated on the top surface of the substrate and patterned using a microfabrication process or in another manner. For example, the first and second electrodes 102A, 102B may be formed by performing at least some of the following fabrication steps: using chemical vapor deposition (CVD), physical vapor deposition (PVD), atomic layer deposition (ALD), spin-on coating, and/or other suitable techniques to deposit respective superconducting layers on the substrate; and performing one or more patterning processes (e.g., a lithography process, a dry/wet etching process, a soft/hard baking process, a cleaning process, etc.) to form openings in the respective superconducting layers. In some instances, the tunneling barrier 104 may be formed using a thermal oxidation process, a plasma oxidation process, a physical vapor or chemical vapor deposition process, or another type of process.

In some instances, the tunnel junction 100 may be used in a superconducting quantum circuit of a quantum processing unit. The superconducting quantum circuit may include data qubit devices, stabilizer qubit devices, coupler devices, readout devices, and possibly other devices that are used to store and process quantum information. In some cases, a qubit device in a superconducting quantum circuit may include one or more Josephson junctions, each of which includes a tunnel junction. In certain examples, the qubit devices and the coupler devices are implemented as superconducting quantum circuit devices that include Josephson junctions, for example, in Superconducting QUantum Interference Device (SQUID) loops or other arrangements, and are controlled by radio-frequency signals, microwave signals, and bias signals delivered to the quantum processing unit according to at least in part of properties of the tunnel junctions. For example, Transmon are made by exploiting the plasma oscillations (plasmon) in a tunnel junction. The frequency spectrum of the transmon is determined in part by the critical current of the tunnel junction at cryogenic temperatures. This critical current is related to the junction resistance of the tunnel junction. In certain cases, the tunnel junction 100 may be used in a wide variety of other applications including tunneling diodes, Schottky diodes, transistors, optical devices, magnetic sensors, microwave detectors, memory device, and a variety of other devices in other applications.

Figure 2:
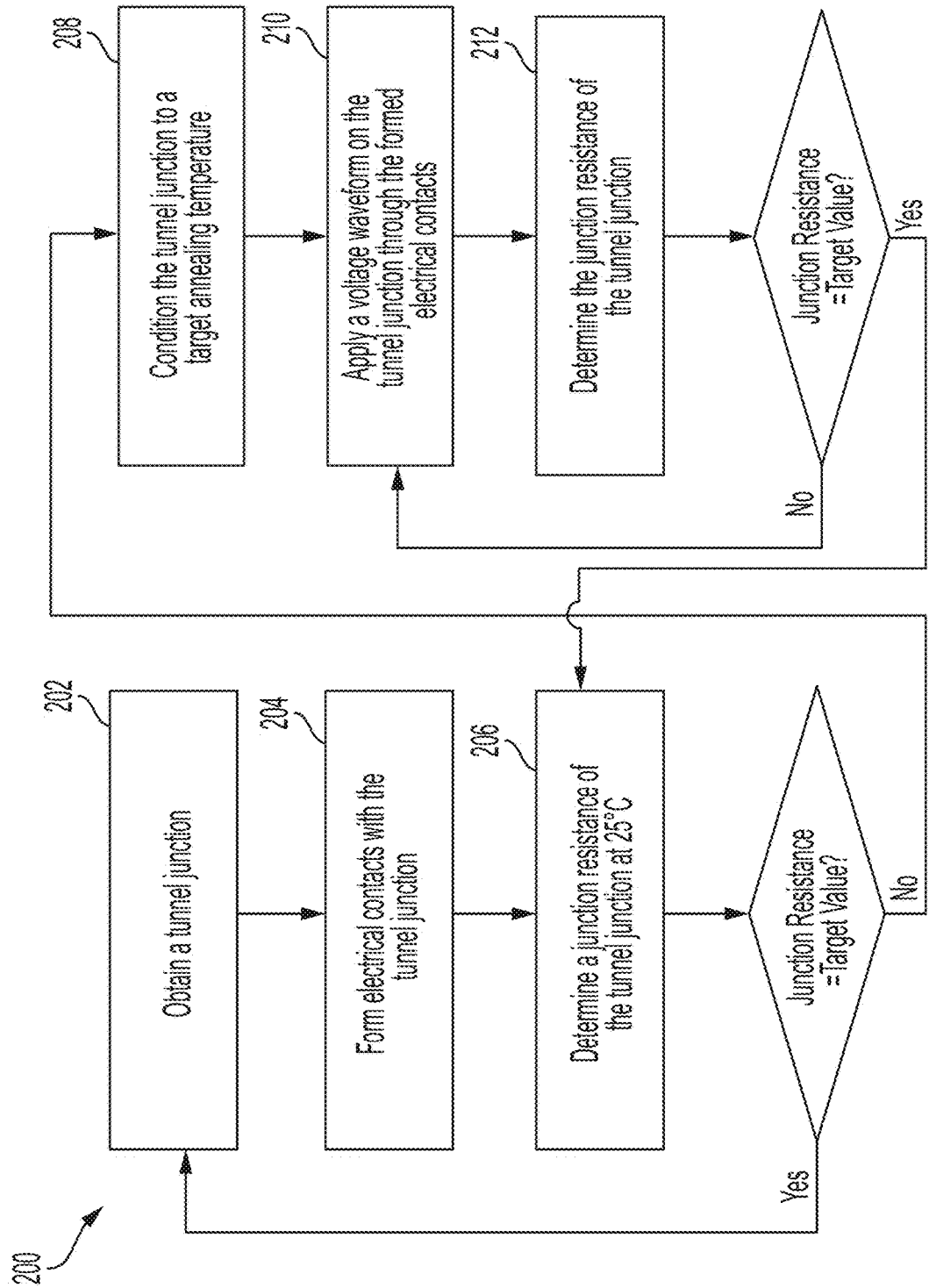
FIG. 2 is a flow chart showing aspects of an example voltage-assisted annealing process.

FIG. 2 is a flow chart showing aspects of an example process 200. In some implementations, the example process 200 is used to identify a tunnel junction (e.g., the tunnel junction 100 shown in FIG. 1) in a circuit according to its one or more properties, e.g., a tunnel junction that has an initial value of a room-temperature junction resistance (e.g., post-fabrication) less than a target value; determine a voltage-assisted annealing process to be applied to the tunnel junction; and apply the voltage-assisted annealing process to the tunnel junction to tune the one or more properties. In some instances, determining the voltage-assisted process includes determining a voltage waveform, a target annealing temperature, and other parameters of the voltage-assisted annealing process. In some implementations, the example process 200 may provide a method to tune post-fabrication properties of one or more tunnel junctions before the circuit is deployed for operation; and the operations in the example process 200 can be repeated and terminated once the properties are compared to a target value associated with the operation of the circuit and a predetermined condition is met. In some instances, the example process 200 can be performed using the example system 300, 1200 shown in FIGS. 3 and 12A-12C or another system. The example process 200 may include additional or different operations, and the operations may be performed in the order shown or in another order. In some cases, operations in the example process 200 can be combined, iterated or otherwise repeated, or performed in another manner.

At 202, a tunnel junction is obtained. In some instances, the tunnel junction is formed and fabricated, e.g., using a microfabrication process or in another manner. In some instances, geometrical and material properties of the tunnel junction are designed according to the post-fabrication performance properties of the tunnel junction or devices or systems where the tunnel junction is used in. The tunnel junction may be then fabricated according to the design of the tunnel junction and conditions of the fabrication process. In some instances, variations in the geometrical and material properties of the tunnel junction caused by the variations in the fabrication process can cause variations in post-fabrication performance properties of the tunnel junctions. For example, variations in the thickness of the barrier layer, dimensions of the first and second electrodes, dielectric properties of the barrier layer may cause variations in the junction resistance, the supercritical current, the barrier height, the operating frequency, or other properties of the tunnel junction. In some instances, the tunnel junction may be part of a fabricated circuit that contains two or more tunnel junctions.

At 204, electrical contacts are formed with the tunnel junction. Different methods can be used to form the electrical contacts with the tunnel junction. For example, wire bonding, flip-chip bonding, or other bonding methods may be used to form electrical contact to the tunnel junction and potentially other tunnel junctions in a device array in order to form electrical contacts for testing, identifying, and communicating annealing pulses to tunnel junctions in the device array. In some instances, a test wafer with a ball grid array or an array of contact pads, pogo pins, needles, or other probe pins, that matches electrical contacts of the tunnel junctions in the device array on a device wafer can be designed and fabricated. In some instances, a probe card (e.g., the probe card 1210 in FIGS. 12B-12C) with multiple pairs of cantilever probes that match a layout of an array of tunnel junctions can be used. In some instances, the test wafer may be aligned and attached to the device wafer to directly form electrical contacts with the tunnel junctions. In some instances, other approaches including manually probing electrodes of a tunnel junction with probes may be used to form the electrical contacts with the tunnel junction. In some instances, a probe card (e.g., the probe card 1210 shown in FIG. 12B) with multiple electrical probes configured to form electrical contacts with multiple tunnel junctions can be used to perform voltage-assisted annealing processes in parallel.

Figure 8:
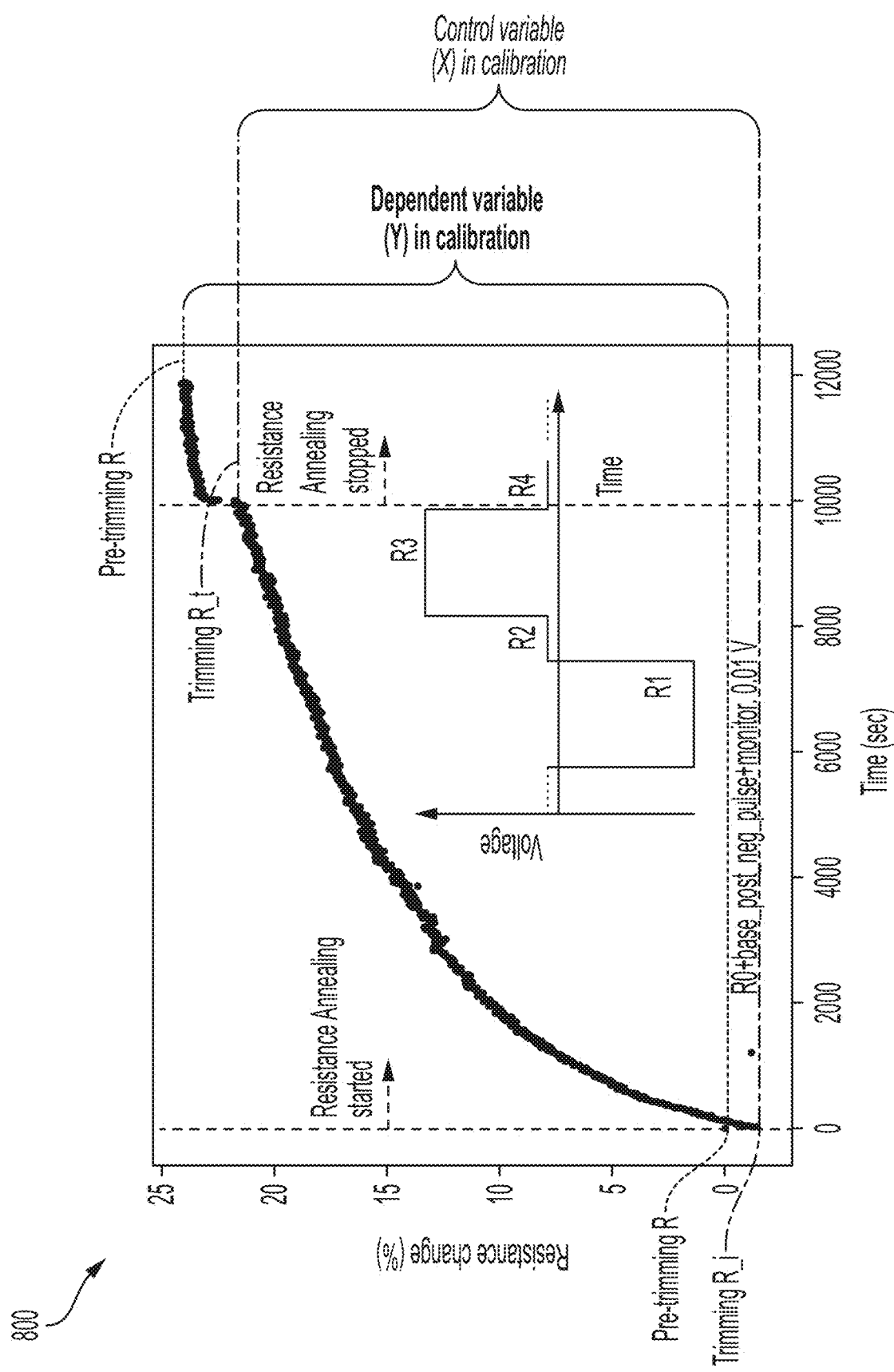
FIG. 8 is a plot showing a fractional change of a junction resistance of a tunnel junction in percentage (%) as a function of time in second during and after a voltage-assisted annealing process.
Figure 9:
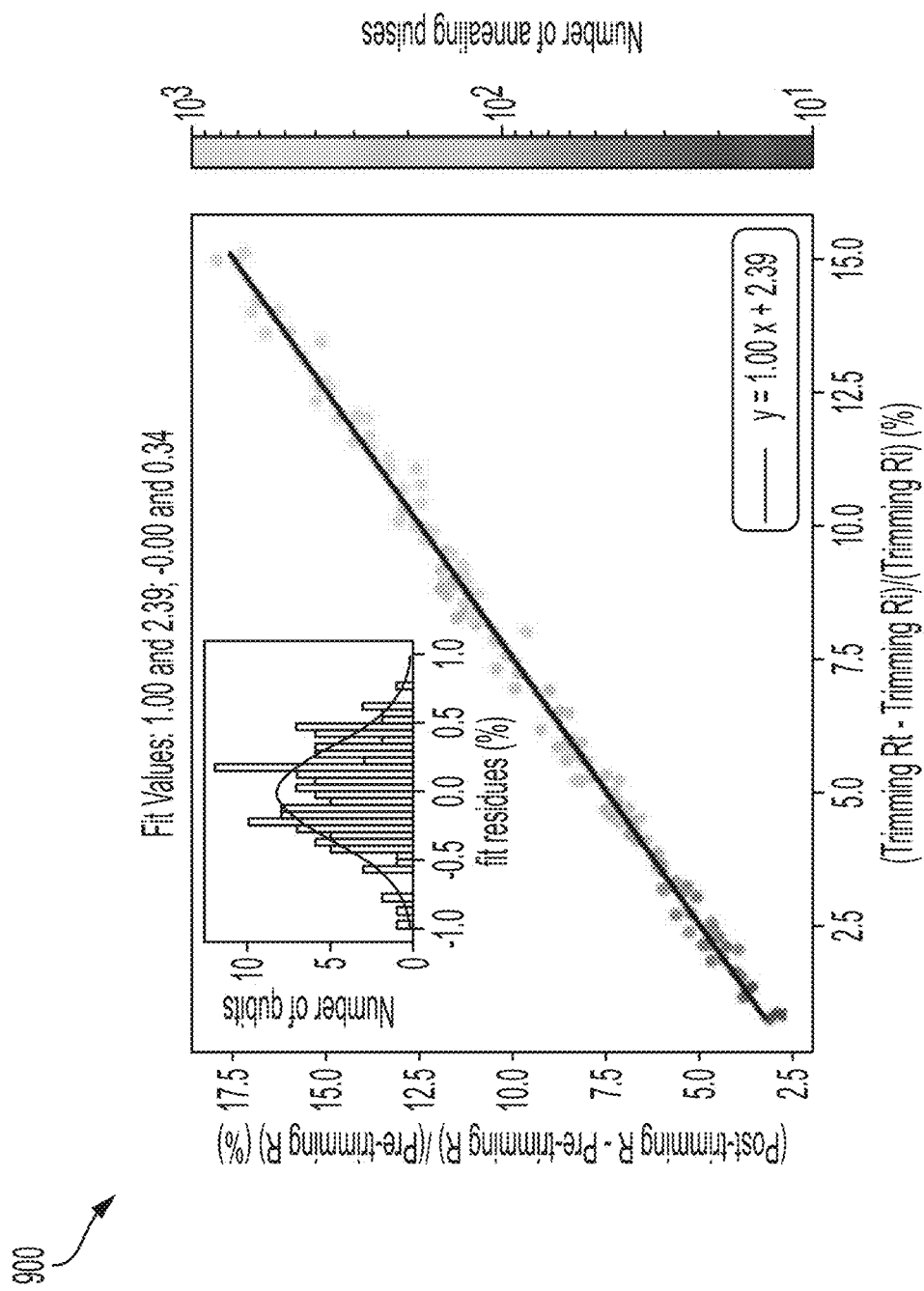
FIG. 9 is a plot showing an example set of calibration data.

At 206, a room-temperature junction resistance is determined. After making the electrical contacts, the tunnel junction may be tested, measured, or otherwise electrically evaluated by applying a measurement voltage or current signal on the formed electrical contacts of the tunnel junction at room temperature (e.g., 25 degrees Celsius). The measurement voltage or current may include a DC signal, an AC signal, or may have another waveform. A current or voltage may be measured to determine the junction resistance. In some instances, the junction resistance may be measured in another manner. The measured value of the junction resistance can be compared to a target value or a target range. In response to the measured value of the room-temperature junction resistance matching the target value within a pre-determined error range or within the target range, the tunnel junction may not need to be treated using a voltage-assisted annealing process. In some instances, the target value may be adjusted according to a calibration data to allow the tunnel junction to age over an aging period (e.g., as shown in FIGS. 8 and 9). The example process 200 continues with the operations 202-206, where another tunnel junction in the same device array, on a different device wafer or dies may be obtained and tested.

In response to the measured value being less than the target value or out of the target range, the example process 200 continues with operation 208, during which the tunnel junction is treated by performing the voltage-assisted annealing process. In particular, at operation 208, the tunnel junction is conditioned to a target annealing temperature of the voltage-assisted annealing process. In some instances, the target annealing temperature of the tunnel junction can be determined according to the measured value and the target value of the room-temperature junction resistance. For example, when a difference between the measured value and the target value is less than a first threshold value, the target annealing temperature may be set to a first value greater than the room temperature; when a difference between the measured value and the target value is greater than the first threshold value and less than a second threshold value, the target annealing temperature may be set to a second value greater than the first value; and when a difference between the measured value and the target value is greater than the second threshold value, the target annealing temperature may be set to a third value greater than the second value. In some instances, the target annealing temperature may be determined based on a predetermined database of calibration date or in another manner. In some instances, the target annealing temperature is in a range of 0 and 673 Kelvin, 0 and 400 degrees Celsius, room temperature and 200 degrees Celsius, or another range.

In some instances, the voltage-assisted annealing process may be performed in different environments, for example, in inert gas, in ambient air, under vacuum, or another environment. In some instances, the annealing environment of the thermal annealing process may be also determined according to the measured value and the target value of the room-temperature junction resistance.

In some instances, a temperature control element can be operated to bring the substrate on which the tunnel junction resides to the target annealing temperature. The temperature control element, which may be implemented as the temperature control element 306 in FIG. 3, may include a heating element, a cooling element, a temperature sensor, or another element. In some instances, a heating element of the temperature control element may include a resistance heating element, an infrared heating element, a convection heating element, a radiation heating element, or another type of heating element. In some instances, a heating rate at which the temperature of the substrate is increased and the amount of time required to heat the substrate from its initial temperature (e.g., room temperature) to the target annealing temperature can be also determined. In response to the initial temperature being the target annealing temperature, the operation 208 may be omitted.

At 210, the voltage waveform is applied to the tunnel junction. In some instances, the voltage waveform may be passively or actively generated using different circuits or instruments. For example, the voltage waveform can be generated using passive components such as resistors, capacitors, and inductors. For another example, the voltage waveform may be generated using an oscillator, a pulse generator, a waveform generator, or other active components. In some instances, the voltage waveform may be generated using the example system 300, 1200 shown in FIGS. 3, 12A or in another manner.

In some instances, a voltage waveform for performing the voltage-assisted annealing of the tunnel junction may be determined according to the determined thermal annealing condition (e.g., the target annealing temperature and environment), the measured and target values of the junction resistance, materials of the tunnel junction, and other factors. In some implementations, the voltage waveform is used to create an electrical field across the tunnel junction. In some instances, the voltage waveform applied to the tunnel junction may be a square wave, a pulse wave, a ramp wave, a triangular wave, a sawtooth wave, a sinusoidal wave, a tangent wave, a stepped wave, an arbitrary waveform, a complex waveform, or another type of waveform. In some instances, the voltage waveform may be monopolar (e.g., with only positive or negative polarity as the example shown in FIGS. 4A, 5A) or bipolar (e.g., alternating positive and negative polarity as the example shown in FIG. 7A). In some implementations, parameters of the voltage waveform, including amplitude and polarity of annealing pulses ($V_A$), frequency, duty cycle, on time, off time, rise time, fall time, duration, and other parameters, may be adjusted. In some implementations, the effect of the voltage waveform on tuning the junction resistance of the tunnel junction is adjusted by tuning the parameters of the voltage waveform. In some implementations, the amplitude of the annealing pulses is at a low voltage, which is less than the breakdown voltage of the tunneling barrier according to the dielectric strength of the tunneling barrier. For example, the amplitude of the annealing pulses can be in a range of 0.5-1.5 V or in another range. In some instances, the amplitude of the annealing pulses can be experimentally determined. In some instances, the amplitude of the annealing pulses is less than the voltage which creates a short- or open-circuit between the electrodes across the amorphous layer to preserve the functionality of the tunnel junction. In some implementations, parameters of the voltage waveform, e.g., amplitude, duration, polarity, shape, number, etc. of the annealing pulses, can be changed or updated during the annealing process according to the response of the tunnel junction (e.g., the amount of changes in the junction resistance) to the voltage waveform.

At 212, the junction resistance of the tunnel junction is determined. In some implementations, the room-temperature junction resistance of the tunnel junction is measured at room temperature by applying a measurement voltage pulse ($V_m$) across the tunnel junction. In some implementations, the amplitude of the measurement voltage pulse $V_m$ is less than that of the annealing voltage pulse $V_A$. In some instances, the amplitude of the measurement voltage pulse is less than the amplitude of the annealing voltage pulse. For example, the measurement voltage pulse may have an amplitude in a range of 1 and 100 millivolt (mV) or another range. In some instances, the polarity of the measurement voltage pulse may be different from the polarity of the annealing voltage pulse. In some instances, the amplitude of the measurement pulses can be experimentally determined. In some instances, the amplitude of the measurement pulses depends on the materials, or other properties of the tunnel junction.

In some instances, the measured value of the junction resistance can be compared to the target value of the junction resistance at the target annealing temperature. In some instances, the target value of the junction resistance at the target annealing temperature may be different from the target value of the room-temperature junction resistance; and may be determined according to the Ambegaokar-Baratoff formula or in another manner. In response to the measured value being less than the target value at the target annealing temperature, the example process 200 continues with operation 210 during which the voltage waveform is applied; and operation 212 during which the junction resistance can be measured and compared with the target value at the target annealing temperature. In some instances, the parameters of the voltage waveform used can be adjusted during subsequent operations according to the measured value and the target value at the target annealing temperature. For example, the number of annealing pulses in the voltage waveform can be increased; the amplitude of the annealing pulses can be increased; the duration of the annealing pulses can be increased; etc. In some instances, the thermal annealing conditions may be maintained during the iterative operations of 210 and 212. In some instances, the thermal annealing conditions, e.g., the target annealing temperature and annealing environment, may be adjusted during the iterative operations of 210 and 212 based on the measured value and target value of the junction resistance, material properties, and possibly other factors. In some instances, other extrinsic effects may be also calibrated, such as the substrate resistances and how it changes with the thermal annealing conditions (e.g., thermal annealing temperature and thermal annealing environment), the annealing pulses, and possibly other factors. In some instances, the target value of a room-temperature junction resistance is determined based on calibration data, for example as shown in FIGS. 8 and 9. In some instances, the operations 202-212 in the example process 200 can be performed on multiple tunnel junctions so as to tune their respective junction resistance simultaneously or in parallel by operation of multiple single-channel source measurement units (SMUs) (e.g., the SMU 304 in FIG. 3) or a multi-channel SMU (e.g., the control system 1200 shown in FIG. 12A). Waveforms with different parameters can be configured according to one or more properties of the respective tunnel junctions. In some instances, when the waveform shown in FIG. 7A is used in the method 200, the method is an alternating-bias assisted annealing (ABAA) process.

Figure 3:
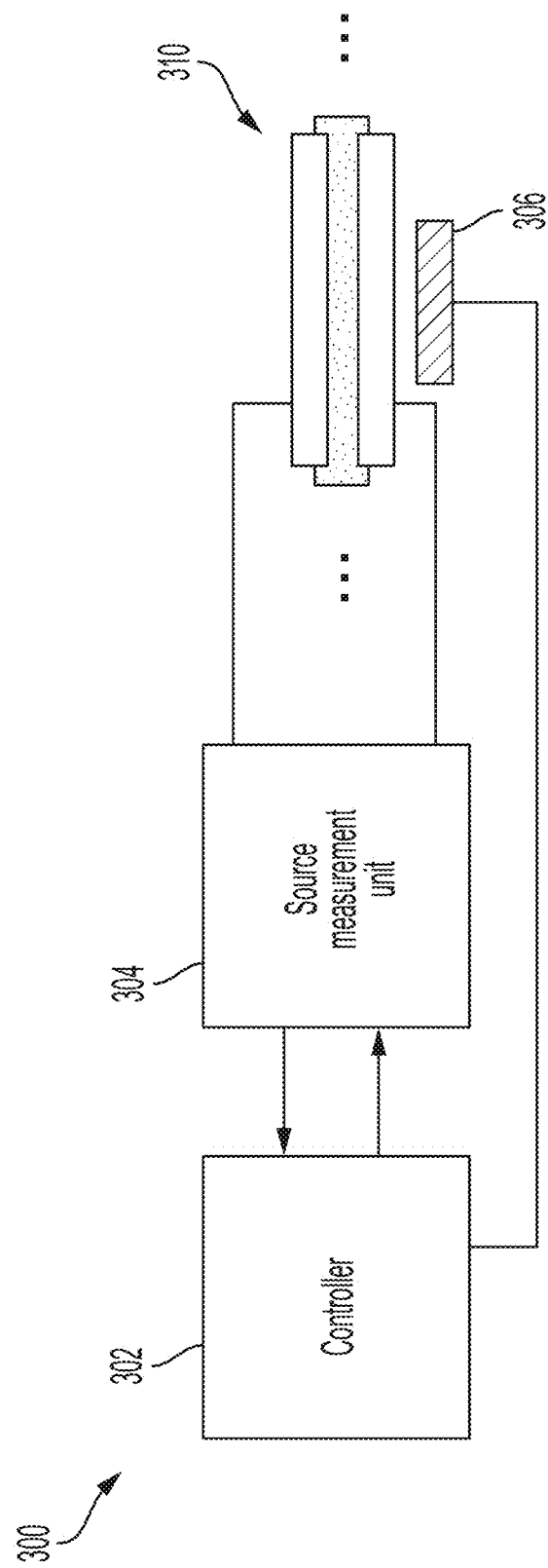
FIG. 3 is a schematic diagram showing an example system for performing voltage-assisted annealing on a tunnel junction.

FIG. 3 is a schematic diagram showing aspects of an example control system 300. The example control system 300 is configured to apply a voltage-assisted annealing process to a tunnel junction 310 to tune one or more junction properties of the tunnel junction. In some instances, the example control system 300 may be configured to perform the iterative operations in the example process 200. In particular, the example control system 300 is configured to measure a junction resistance of a tunnel junction; and to alter the junction properties so as to tune the junction resistance to a target value. As shown in FIG. 3, the example control system 300 includes a controller 302 and a source measurement unit 304 communicably coupled to the controller 302. The example system 300 further includes a temperature control unit 306 communicably coupled to the controller 302. In some instances, the example system 300 may include additional or different features, and the components of a computing environment may operate as described with respect to FIG. 1 or in another manner.

In some implementations, the controller 302 is configured to determine, update and otherwise, modify parameters of a voltage waveform; and schedule the voltage waveform to be applied to the tunnel junction. The source measurement unit 304 is configured to generate the voltage waveform and communicate the voltage waveform to the tunnel junction 310. The source measurement unit 304 is also configured to measure the current across the tunnel junction 310 in response to an applied measurement voltage pulse. A junction resistance may be determined, e.g., based on Ohms law by operation of the source measurement unit 304 or the controller 302. In some instances, the controller 302 is also configured to determine a target annealing temperature under which the voltage-assisted annealing process is performed. The controller 302 communicates control signals to the temperature control unit 306 to condition the tunnel junction 310 to the target annealing temperature. In some instances, the controller 302 may receive signals from temperature sensors in the temperature control unit 306. The controller 302 may terminate the voltage-assisted annealing process when a predetermined condition is met, e.g., a measured value of the junction resistance is equal to the target value within a predetermined error range; a measured value of the junction resistance is equal to an intermediate target value less than the target value to allow the tunnel junction over an aging period, or another predetermined condition. In some instances, the source measurement unit 304 may include a current meter, an alternative voltage source, or other components. In some instances, the source measurement unit 304 may be communicably coupled to electrodes of the tunnel junction 310 through a two-point probe configuration, a 4-point probe configuration, or another configuration.

Figure 4A:
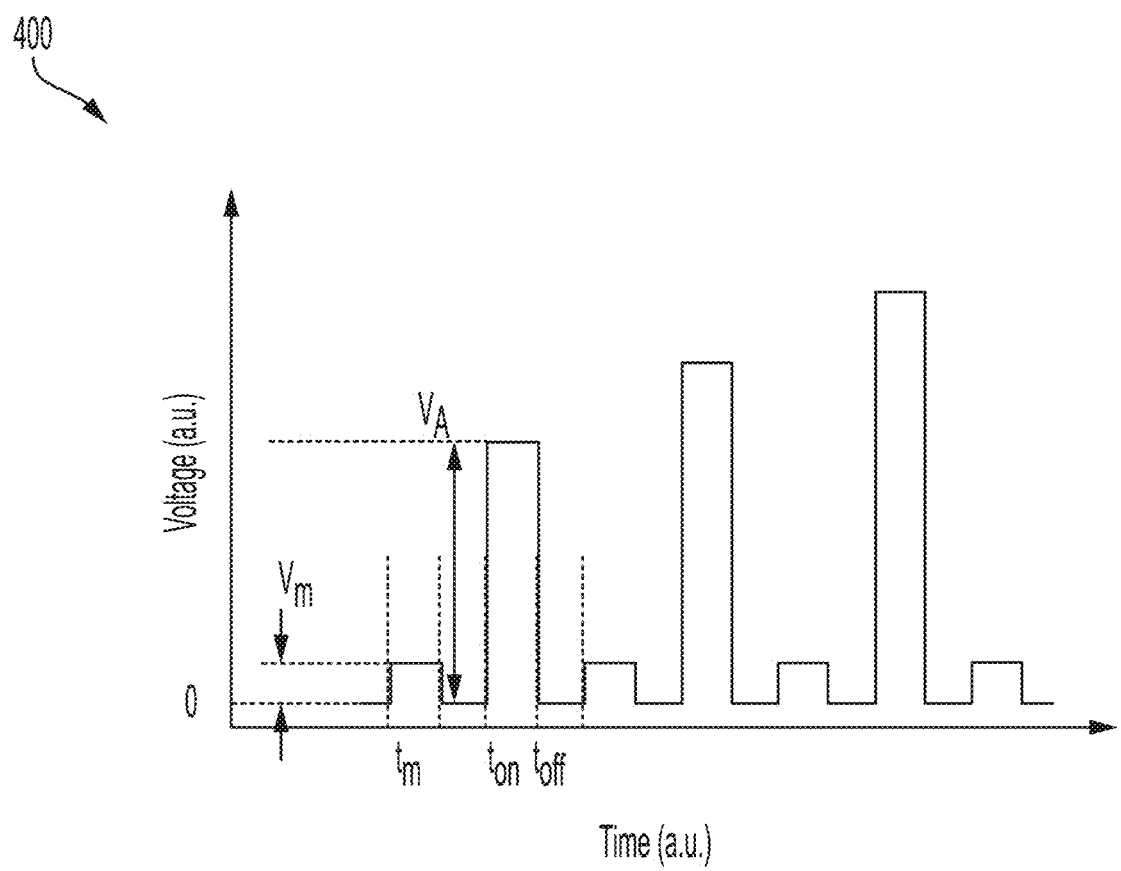
FIG. 4A is a plot showing aspects of an example voltage waveform used in a voltage-assisted annealing process of a tunnel junction.
Figure 4B:
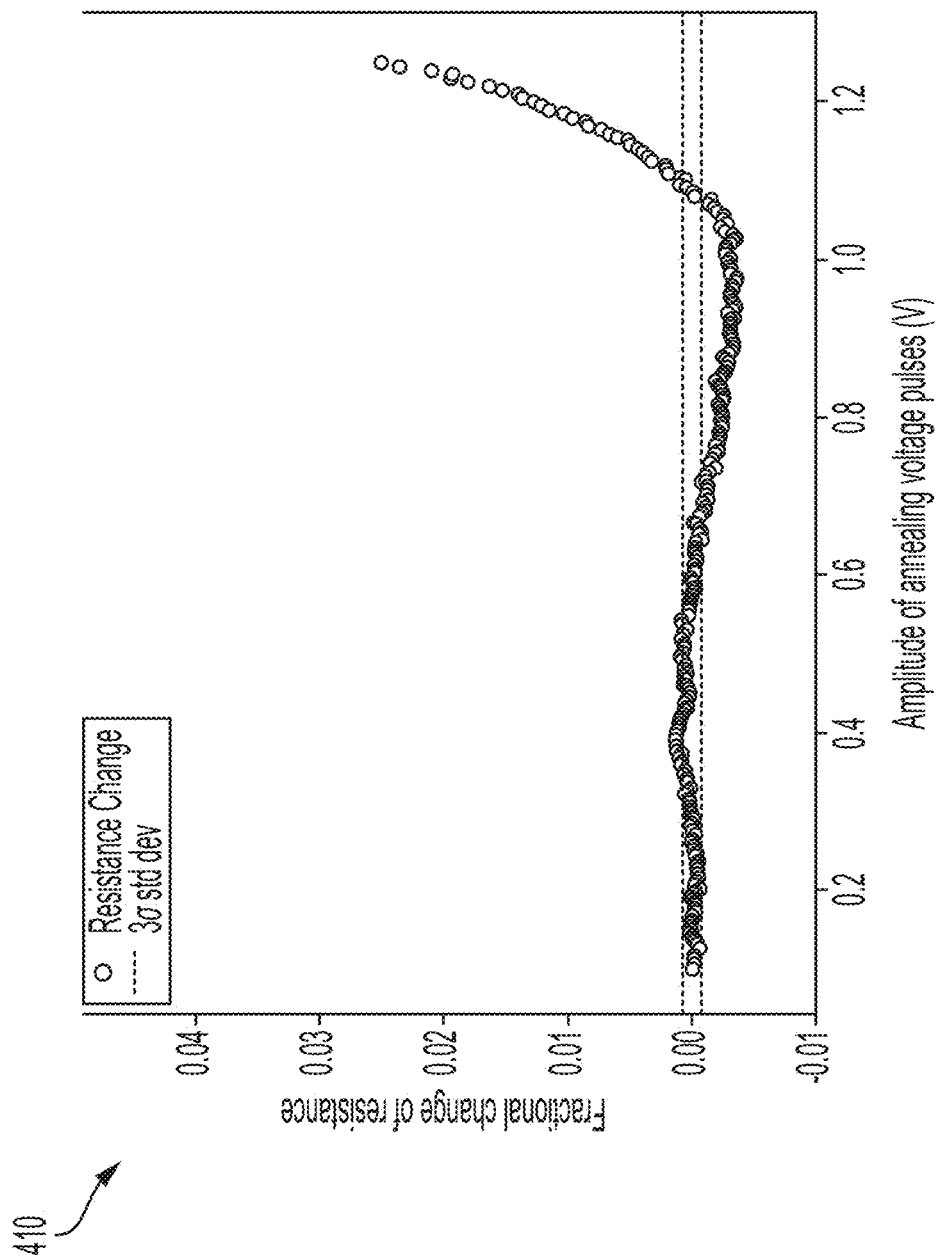
FIG. 4B is a plot showing a fractional change of a junction resistance of a tunnel junction as a function of the amplitude of annealing pulses in the voltage waveform shown in FIG. 4A.
Figure 5A:
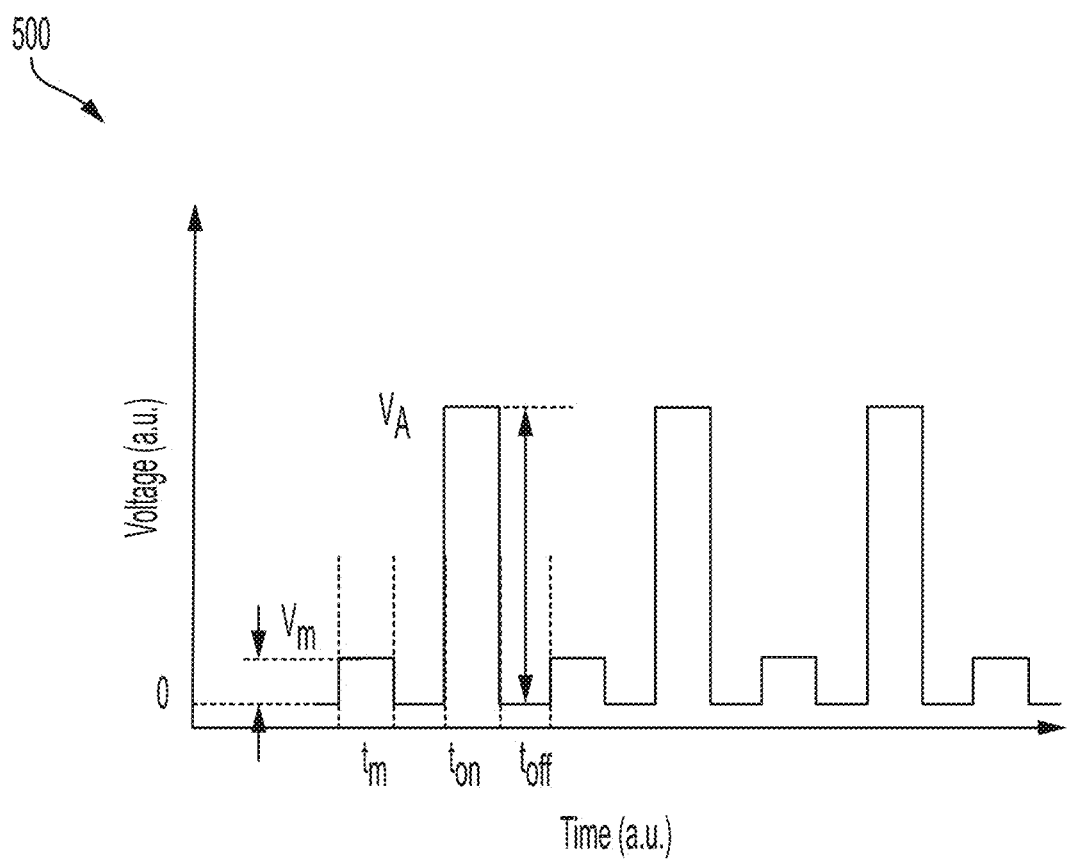
FIG. 5A is a plot showing aspects of an example voltage waveform used in a voltage-assisted annealing process.
Figure 7A:
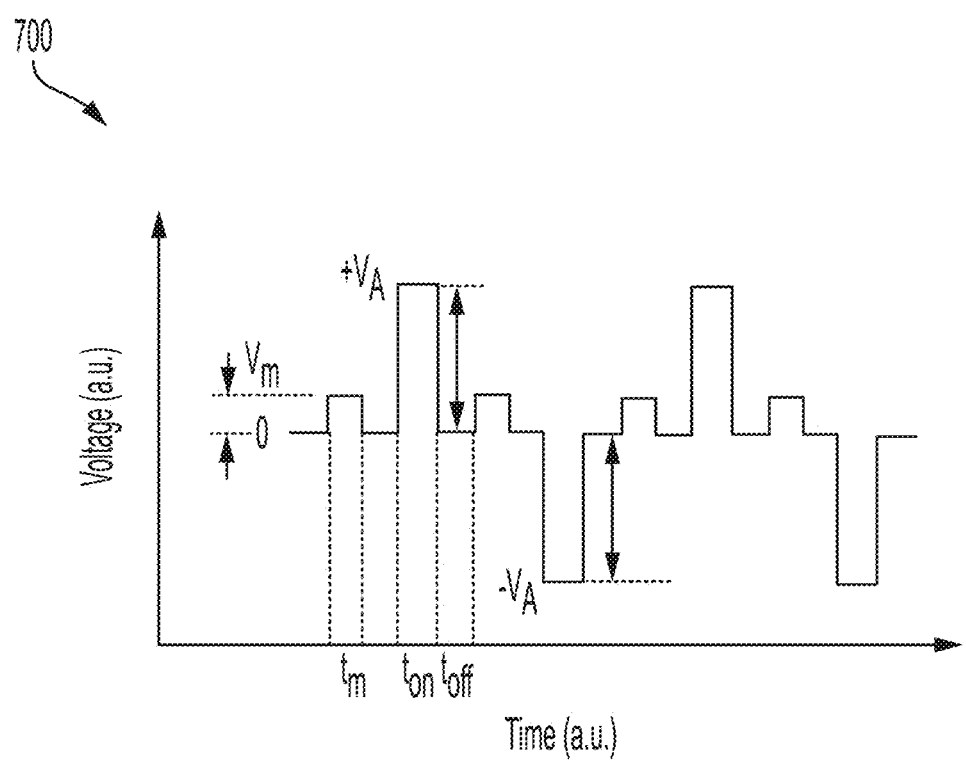
FIG. 7A is a plot showing aspects of an example voltage waveform used in a voltage-assisted annealing process.

Some example voltage waveforms including square pulses applied to the tunnel junction are shown in FIGS. 4A, 5A, 7A. In particular, as shown in FIG. 4A, the voltage waveform 400 includes square wave annealing pulses and square wave measurement pulses. All the annealing pulses and all the measurement pulses have the same polarity. Each annealing pulse has an on time ($t_{on}$) of 1 second; and the amplitudes ($V_A$) of the annealing pulses increase monolithically from 0 V to 1.25 V. Each annealing pulse is followed by a measurement pulse. The amplitude ($V_m$) of the measurement pulses are kept at a constant of 10 mV. Each annealing pulse is turned off for an off time ($t_{off}$) prior to the onset of a subsequent measurement pulse. The tunnel junction includes a pair of metal electrodes and an oxide of that metal, e.g., an aluminum-aluminum oxide-aluminum (Al/AlO$_x$/Al) tunnel junction. During the application of the voltage waveform, the temperature of the tunnel junction is kept at room temperature (e.g., 25 degrees Celsius) in an ambient environment. FIG. 4B includes a plot 410 showing a fractional change in measured values of the junction resistance using the measurement pulses as a function of the amplitude of the annealing pulses in the example voltage waveform 400 shown in FIG. 4A. As shown in FIG. 4B, an initial decrease in resistance is observed; and the measured value of the junction resistance increases steadily after the amplitude of the annealing pulses becomes greater than 1 V. A 3% increase in junction resistance can be achieved when the amplitude of the annealing pulse reaches 1.25 V. As further shown in FIG. 4B, the change in junction resistance is irreversibility even when the annealing pulses are turned off during the off periods.

As shown in FIG. 5A, the voltage waveform 500 includes square wave annealing and square wave measurement pulses. All the annealing pulses and all the measurement pulses have the same polarity. Each annealing pulse has an on time ($t_{on}$) of 1 second; and the amplitude $V_A$ of the annealing pulses is kept at a constant value. Each annealing pulse is followed by a measurement pulse. The amplitude $V_m$ of the measurement pulses is also kept at a constant value of 10 mV. Each annealing pulse is turned off for an off time ($t_{off}$) during an off period. The tunnel junction includes an aluminum-aluminum oxide-aluminum (Al/AlO$_x$/Al) tunnel junction. During the application of the voltage waveform, the temperature of the tunnel junction is kept at room temperature (25 degrees Celsius) in an ambient environment.

Figure 5B:
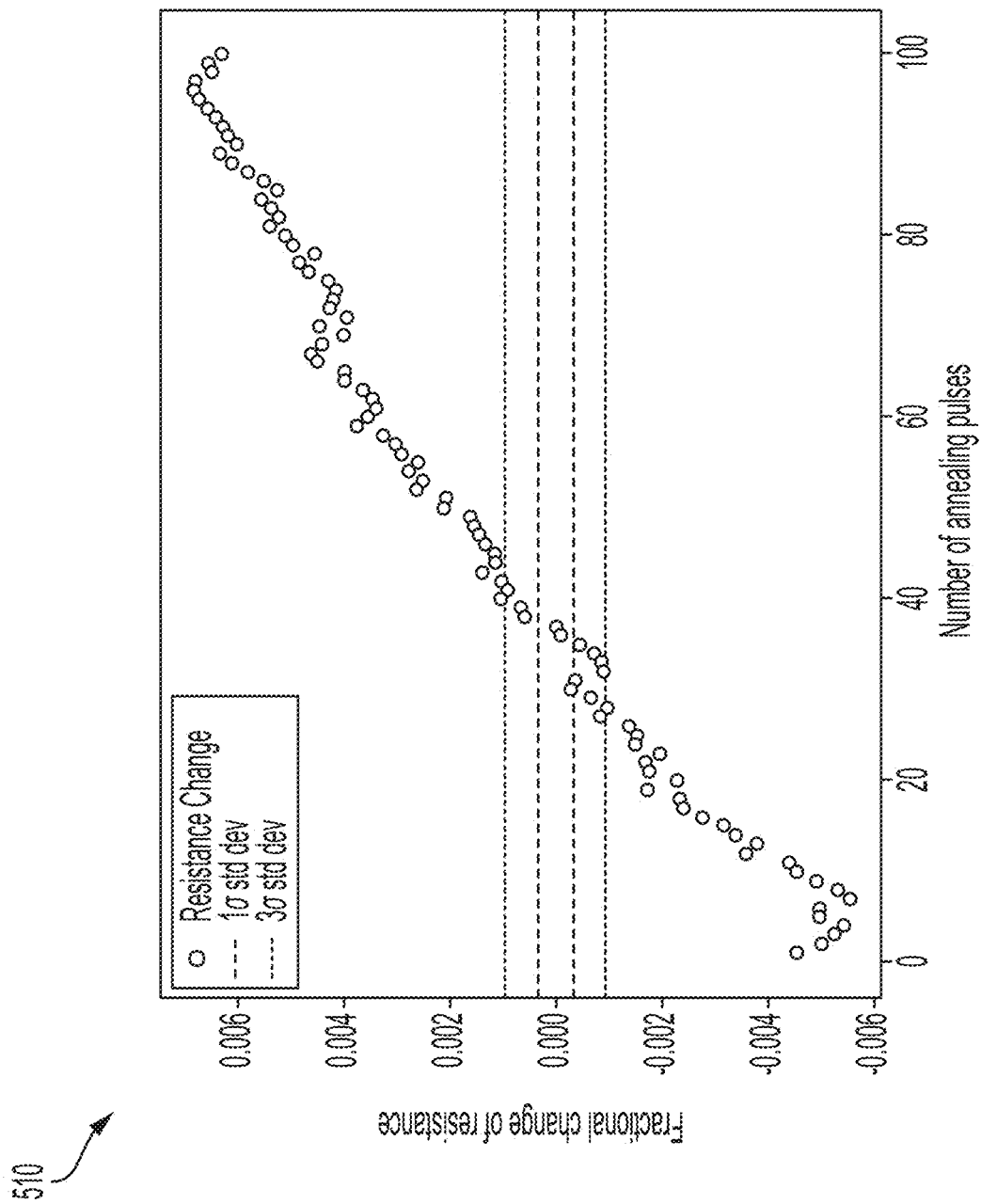
FIG. 5B is a plot showing a fractional change of a junction resistance of a tunnel junction as a function of the number of annealing pulses with an amplitude of 1 V in the voltage waveform shown in FIG. 5A.

FIG. 5B is a plot 510 showing a fractional change in the measured value of the junction resistance using the measurement pulses as a function of the number of annealing pulses with an amplitude of 1 V based on the voltage waveform 500 shown in FIG. 5A. As shown in FIG. 5B, an initial decrease in resistance is observed; and the measured value of the junction resistance increases steadily as the annealing pulses are periodically applied. A 0.6% increase of resistance can be achieved with the annealing volage pulse of 1 V after applying 100 annealing pulses. As further shown in FIG. 5B, the change in the measured values of the junction resistance is irreversibility even when the annealing pulses are turned off during the off periods.

Figure 5C:
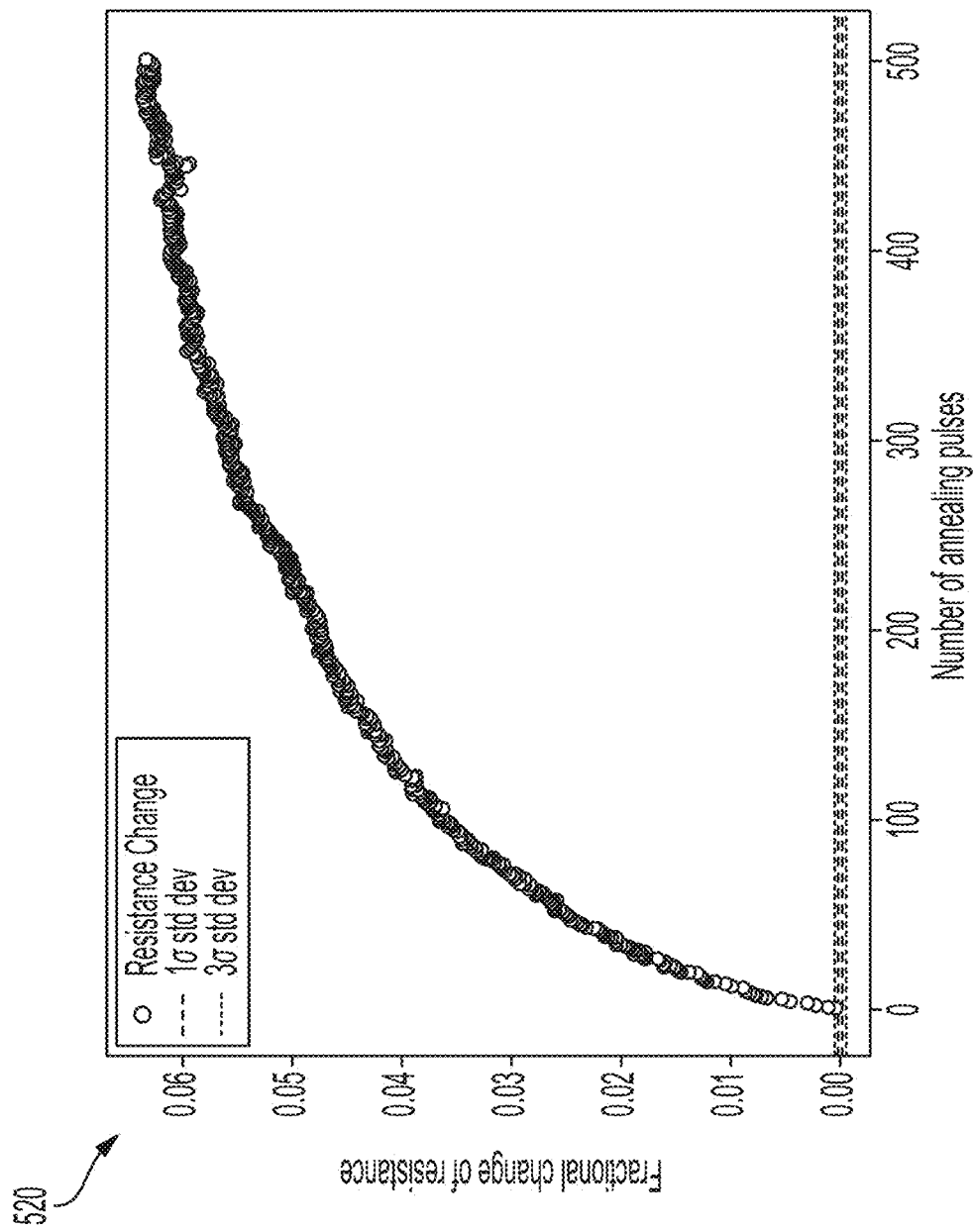
FIG. 5C is a plot showing a fractional change of a junction resistance of a tunnel junction as a function of the number of annealing pulses with an amplitude of 1.1 V in the voltage waveform shown in FIG. 5A.

FIG. 5C is a plot 520 showing a fractional change in the measured value of the junction resistance of a tunnel junction as a function of the number of annealing pulses with an amplitude of 1.1 V according to the voltage wavefunction 500 shown in FIG. 5A. As shown in FIG. 5C, the measured value of the junction resistance increases steadily as the annealing pulses are periodically applied to the tunnel junction. A 3% increase in junction resistance can be obtained after applying 100 annealing pulses; and a 6% increase in junction resistance can be achieved after applying 500 annealing pulses. As further shown in FIG. 5C, the change in junction resistance is irreversibility even when the annealing pulses are turned off during the off periods and also during the period when the measurement pulses are applied.

Figure 6:
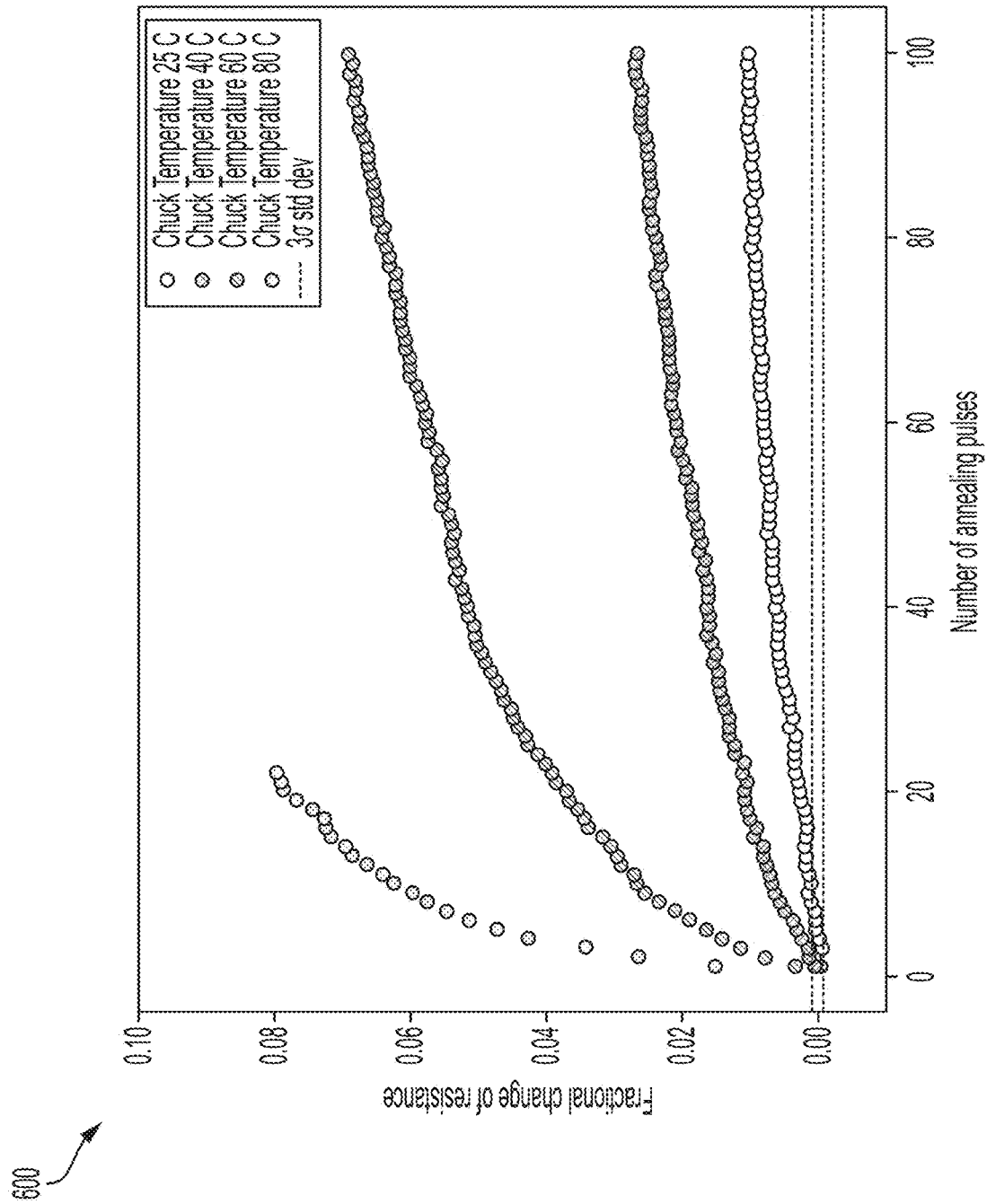
FIG. 6 is a plot showing a fractional change of a junction resistance of a tunnel junction as a function of the number of annealing pulses with an amplitude of 1.1 V in the voltage waveform shown in FIG. 5A at various thermal annealing temperatures.

FIG. 6 is a plot 600 showing a fractional change in the measured value of the junction resistance of a tunnel junction as a function of the number of annealing pulses at various annealing temperatures. This data is taken from four different junctions that were treated using a voltage-assisted annealing process according to the voltage waveform 500 shown in FIG. 5A with an amplitude of the annealing pulses at 1.1 V. The four tunnel junctions are annealed at 25, 40, 60, and 80 degrees Celsius. The junction resistance of the four tunnel junctions is measured at the respective annealing temperatures. shown in FIG. 6, the rate of the change in junction resistance increases significantly with the increasing annealing temperature. Up to 8% increase in junction resistance can be observed after 20 annealing pulses at 80 degrees Celsius. In other words, increasing the annealing temperature of the tunnel junction has the effect of accelerating the resistance change.

As shown in FIG. 7A, the voltage waveform 700 includes bipolar square wave annealing pulses and monopolar square wave measurement pulses. Neighboring annealing pulses have the opposite polarities. Each annealing pulse has an on time ($t_{on}$) of 1 second; and the amplitude $V_A$ of the annealing pulses is kept at a constant value of 0.9 V. Each annealing pulse is followed by a measurement pulse. The amplitude $V_m$ of each measurement pulses are kept at a constant value of 10 mV. Each annealing pulse is turned off for an off time ($t_{off}$) during an off period. The tunnel junction includes an aluminum-aluminum oxide-aluminum (Al/AlO$_x$/Al) tunnel junction. During the application of the voltage waveform 700, the temperature of the tunnel junction is kept at 80 degrees Celsius in an ambient environment; and the resistance value is measured at 80 degrees Celsius. In some instances, the junction resistance may be measured during other stages in an annealing cycle. For example, instead of measuring the junction resistance using measurement pulses during $t_m$ before or after applying the positive annealing pulses, the junction resistance may be measured when the annealing pulses either positive or negative are applied during $t_{on}$. In some instances, measured values of the junction resistance during the same stage in different annealing cycles may be monitored and compared. For example, the measured values of the junction resistance during $t_m$ after applying positive annealing pulses can be stored and used to create calibration data. In some instances, the junction resistance measured during other stages can also be used to generate calibration data.

Figure 7B:
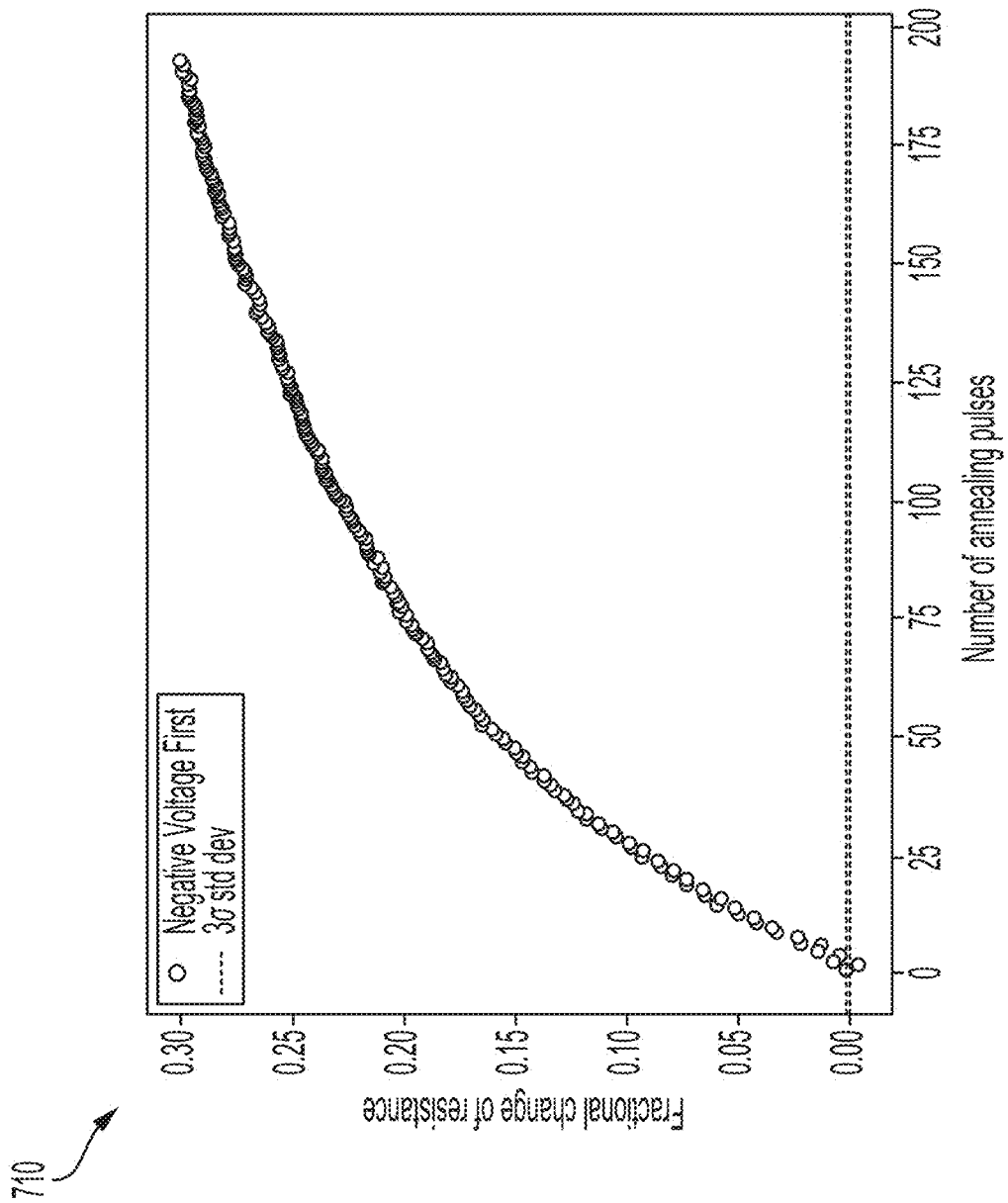
FIG. 7B is a plot showing a fractional change of a junction resistance of a tunnel junction as a function of the number of annealing pulses with an amplitude of 0.9 V in the voltage waveform shown in FIG. 7A at a thermal annealing temperature of 80° C.

FIG. 7B is a plot 710 showing an example of a fractional change in the measured values of the junction resistance of the tunnel junction as a function of the number of annealing pulses with an amplitude of 0.9 V based on the example waveform 700 shown in FIG. 7A. As shown in the example of FIG. 7B, the measured value of the junction resistance increases steadily as the annealing pulses are periodically applied. An about 15% increase in junction resistance can be achieved after applying 50 annealing pulses; and a 30% increase in junction resistance can be achieved after applying 200 annealing pulses. As further shown in FIG. 7B, the increase in junction resistance is irreversibility even when the annealing pulses are turned off during the off periods.

Figure 7C:
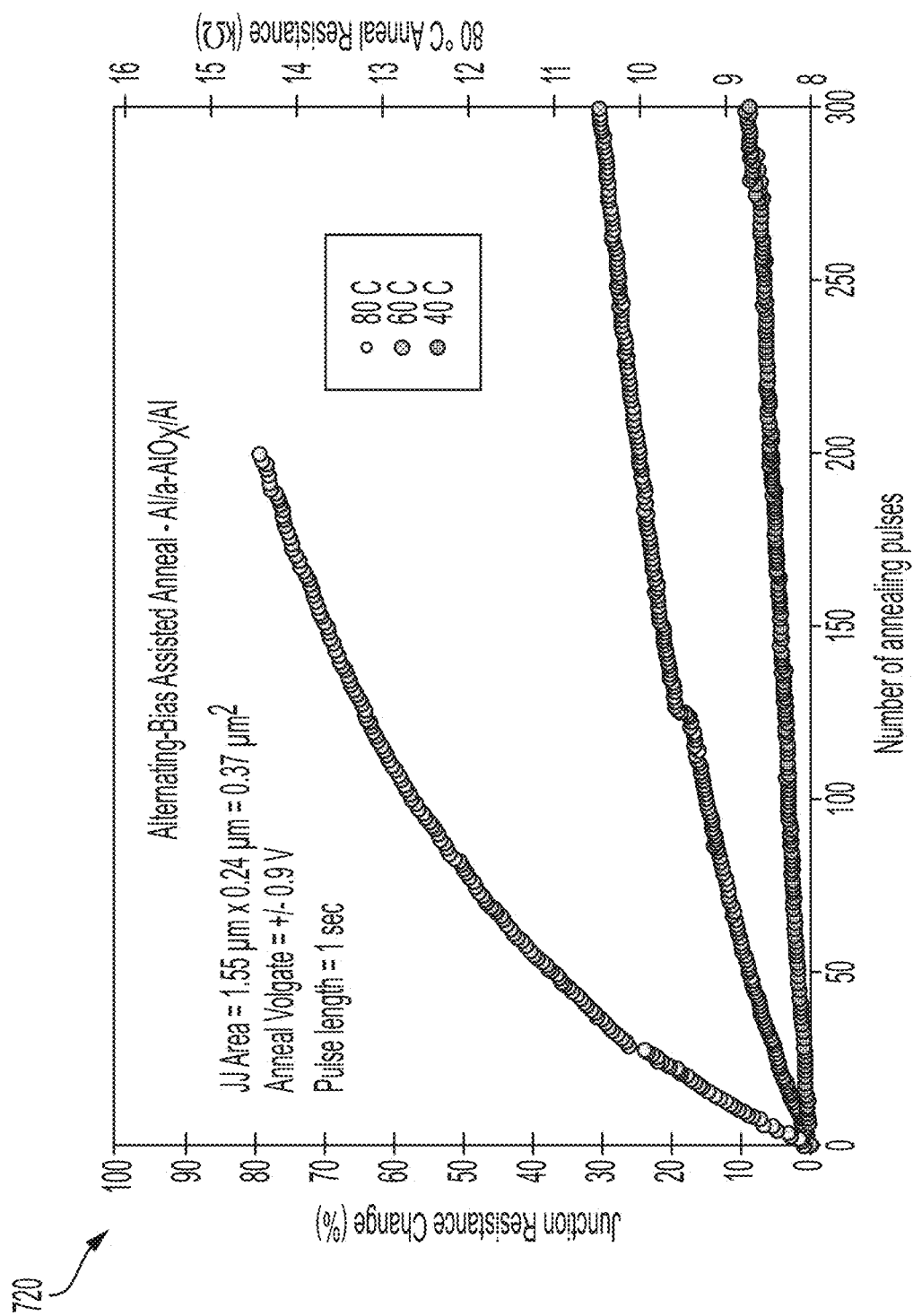
FIG. 7C is a plot showing a fractional change of a junction resistance of a tunnel junction as a function of the number of annealing pulses with an amplitude of 0.9 V in the voltage waveform shown in FIG. 7A at various thermal annealing temperatures.

FIG. 7C is a plot showing an example of fractional changes of a junction resistance of a tunnel junction as a function of the number of annealing pulses with an amplitude of 0.9 V based on the voltage waveform shown in FIG. 7A at various thermal annealing temperatures. This data is taken from three different junctions that were treated using a voltage-assisted annealing process according to the voltage waveform 700 shown in FIG. 7A with an amplitude of the annealing pulses at ±0.9 V. The three tunnel junctions are annealed at 40, 60, and 80 degrees Celsius. The junction resistance of the three tunnel junctions is measured at the respective annealing temperatures. shown in FIG. 7C, the rate of the change in junction resistance increases significantly with the increasing annealing temperature. Up to 80% increase in junction resistance can be observed in the example after 200 annealing pulses at 80 degrees Celsius. In other words, increasing the annealing temperature of the tunnel junction has the effect of accelerating the resistance change. In some instances, the range of the resistance change (e.g., percentage increase in junction resistance) varies from device to device; and can be affected by the structure, material, temperature, waveform applied, history of the tunnel junction and other parameters.

In some instances, in response to the measured value of the junction resistance matching the target value at the target annealing temperature or falling in the target range at the target annealing temperature, the example process 200 continues with operation 206, during which the junction resistance is further measured at room temperature, e.g., after cooling down the tunnel junction from the target annealing temperature to room temperature. In response to the measured value of the junction resistance at room temperature meeting the specification (e.g., equal to the target value or falling in the target range at room temperature), the process 200 continues with operation 202 during which a different tunnel junction may be obtained, and its junction properties can be altered by applying a voltage-assisted annealing process.

FIG. 8 is a plot 800 showing a fractional change in the measured values of the junction resistance of the tunnel junction as a function of time. During a first time period (e.g., between 0 second and 10,000 second), annealing pulses with an amplitude of 0.9 V based on the example waveform 700 shown in FIG. 7A in an alternating-bias assisted annealing (ABAA) process (e.g., the example process 200 shown in FIG. 2) are periodically and continuously applied on the tunnel junction. During the application of the voltage waveform 700, the temperature of the tunnel junction is kept at room temperature in an ambient environment; and the resistance value is measured at room temperature. Before the annealing pulses are applied to the tunnel junction at t=0, an initial value of the junction resistance is determined and denoted as Pre-trimming R. After the annealing pulses in the first annealing cycle are applied to the tunnel junction, the measured value of the junction resistance (denoted as Trimming $R_i$) at the end of the first annealing cycle can be determined. As shown in FIG. 8, the measured value of the junction resistance first reduces from Pre-trimming R to Trimming $R_i$; and the measured value of the junction resistance then increases steadily from Trimming $R_i$ to a value denoted as Trimming $R_t$. In some implementations, the junction resistance during the annealing process is measured and monitored after positive annealing pulses are applied, e.g., during R4 stages. In some instances, the junction resistance is measured during the same stages in the annealing cycle, for example, Trimming Ri and Trimming Rt may be measured after negative annealing pulses are applied. After the annealing process is terminated, e.g., no annealing pulses are applied to the tunnel junction, the junction resistance can be periodically monitored, e.g., using the waveform 700 without applying the annealing pulses. As shown in the example of FIG. 8, the increase in junction resistance may be irreversible even when the annealing pulses are turned off. Furthermore, the measured value of the junction resistance shows a relatively quick increase soon after the annealing pulses are turned off; and eventually stabilizes to a value denoted as Post-trimming R after 12,000 seconds. In some implementations, the Post-trimming R where the junction resistance stabilizes at is the target value of the junction resistance of the tunnel junction.

In some implementations, in order to achieve the first target value of the junction resistance (e.g., Post-trimming R), the annealing process (e.g., application of the waveform 700 in FIG. 7A) is terminated or the annealing pulses is turned off prior to the target value of the junction resistance is achieved to allow aging and stabilization of the junction resistance. In some examples, the annealing process may be terminated when the measured value of the junction resistance reaches a second target value, e.g., Trimming $R_t$. In some instances, Trimming $R_t$ can be determined based on a set of predetermined calibration data and the values of pre-trimming R measured before annealing and Trimming $R_i$ measured during the first annealing cycle, e.g., at stage R4 of the first annealing cycle, and Post-trimming R.

In some instances, a set of calibration data can be obtained by measuring respective values of Trimming $R_i$, Trimming $R_t$, pre-trimming R, and post-trimming R by performing the same annealing process on multiple tunnel junctions formed using the same fabrication process. FIG. 9 is a plot 900 showing an example set of calibration data. The calibration data in the plot 900 shows a fractional change in the measured values of the junction resistance (Post-trimming R−Pre-trimming R)/(Pre-trimming R) in percentage (%) as a function of a fractional change in measured values of the junction resistance (Trimming $R_t$−Trimming $R_i$)/(Trimming $R_i$) in %. In some instances, the set of calibration data may be presented in another manner. By using the example set of calibration data and the values of Post-trimming R, Pre-trimming R, and Trimming $R_i$, the value of Trimming $R_t$ can be determined and used to control the annealing process, e.g., terminate the annealing process when the measured value of the junction resistance reaches the value of Trimming $R_t$. In some instances, multiple sets of calibration data obtained on tunnel junctions under different annealing conditions (e.g., voltage waveform used, annealing temperature and environment, etc.) or on tunnel junctions formed using different fabrication processes may be determined and stored in a database. In some instances, a set of calibration data may be selected according to the fabrication process and the annealing condition to be used. In some instances, the value of Trimming $R_t$ can be determined in another manner.

Figure 10:
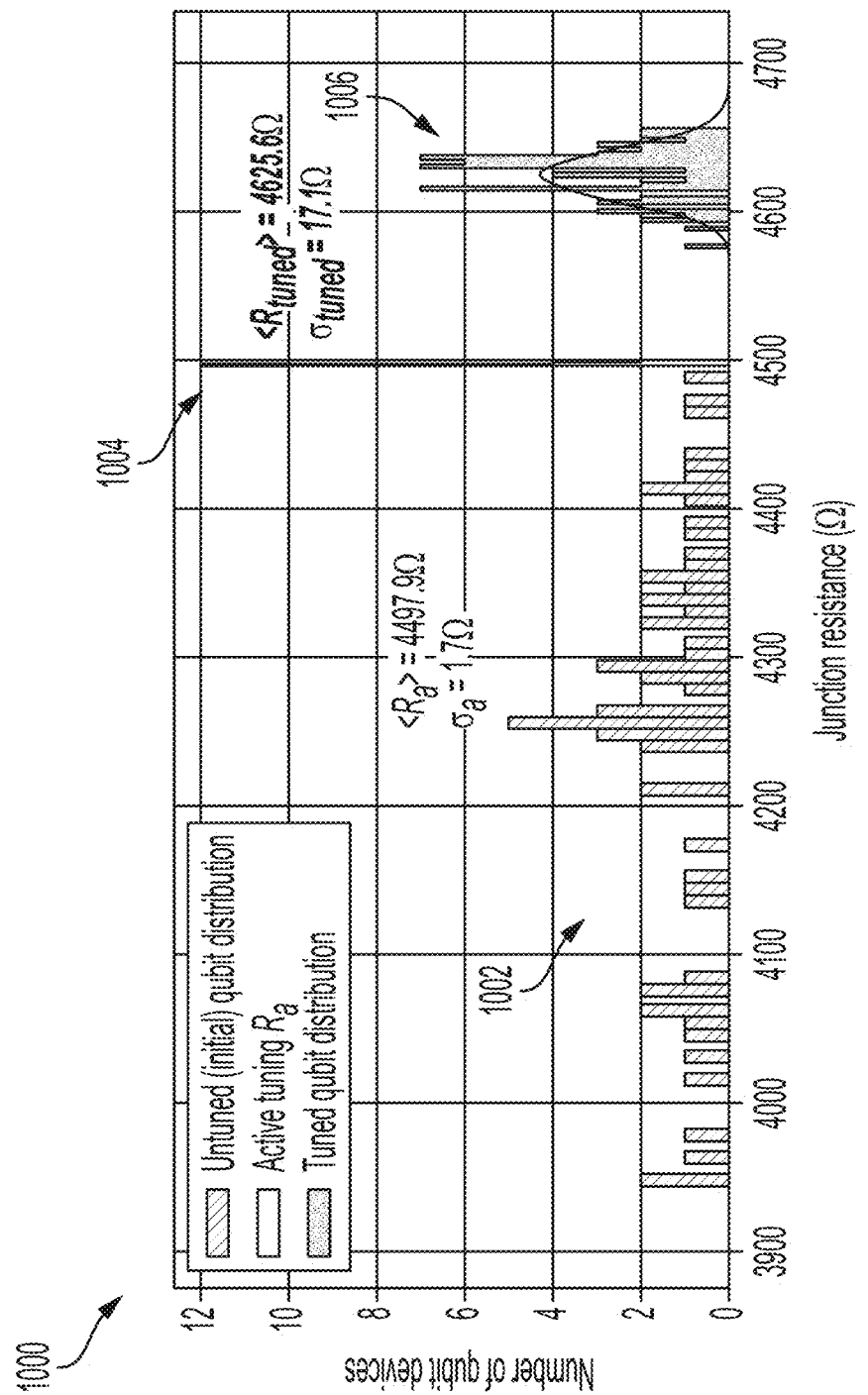
FIG. 10 is a plot showing the number of qubit devices as a function of resistance measured before a voltage-assisted annealing process ($R_{untuned}$), after the voltage-assisted annealing process ($R_a$), and after an aging process ($R_{tuned}$).

FIG. 10 is a plot 1000 showing the number of qubit devices as a function of the measured values of junction resistance of as-fabricated qubit devices without voltage-assisted annealing ($R_{untuned}$), qubit devices with the voltage-assisted annealing ($R_a$), and qubit devices after an aging process ($R_{tuned}$). As shown in a first distribution 1002 of FIG. 10, the measured values of the room-temperature junction resistance $R_{untuned}$ obtained on 61 as-fabricated qubit devices of are in a range of 3900-4500Ω. The bin width in the first distribution 1002 is 7.5Ω.

The room-temperature junction resistance of each qubit device is tuned to a target resistance value of 4496Ω by performing a voltage-assisted annealing process (e.g., the voltage-assisted annealing process 200 shown in FIG. 2). The voltage-assisted annealing process is performed at room temperature in an ambient environment using a voltage waveform with bipolar square wave annealing pulses (e.g., the waveform 700 shown in FIG. 7A) in an alternating-bias assisted annealing (ABAA) process. The voltage-assisted annealing process on a tunnel junction is terminated after detecting the last monitor resistance $R_a$ surpassing the target value of 4496Ω followed by performing a voltage-assisted annealing process on the next tunnel junction. As shown in a second distribution of FIG. 10, the measured values of the room-temperature junction resistance $R_a$ of the 61 qubit devices are centered at a value that is 1.9Ω above the target value of 4496Ω with a standard deviation of 1.7Ω. The bin width in the second distribution 1004 is 0.5Ω.

In some instances, the measured value of the room-temperature junction resistance may continue to evolve even after the voltage waveform is removed from the tunnel junction (e.g., the voltage-assisted annealing process is terminated). In some instances, the evolution of the room-temperature junction resistance may continue for over an extended period of time from hours to days. This is defined as an aging process of the tunnel junction after the voltage-assisted annealing. In some instances, the aging behavior (e.g., change in the measured value of the room-temperature junction resistance as a function of time) may be different for different tunnel junctions. In some instances, subsequent voltage pulse sequences, separately by an extended aging time, can reduce the variation in aging between junctions. In some instances, this variation reduction improves the performance of quantum processing units. As shown in FIG. 10, all the 61 tunnel junctions which are kept at room temperature under the ambient environment for certain waiting time to relax and age show a third distribution 1006 of the resistance values $R_{tuned}$ ranging between 4500 and 4700Ω. In some instances, an average waiting time between the time when the last annealing voltage pulse in the voltage waveform is applied and the time when $R_{tuned}$ is probed is approximately 5 hours. The third distribution 1006 of the measured value of the room-temperature junction resistance $R_{tuned}$ exhibits a 127.7Ω increase of the mean resistance value with a standard deviation of 17.1Ω. The bin width of the third distribution 1006 is 3Ω. In some instances, the increase in the mean resistance value results from the aging behavior within the tunnel junctions, and the increase in spread is dominated by the difference in aging in different tunnel junctions by the time when the resistance value $R_{tuned}$ are measured.

Figure 11:
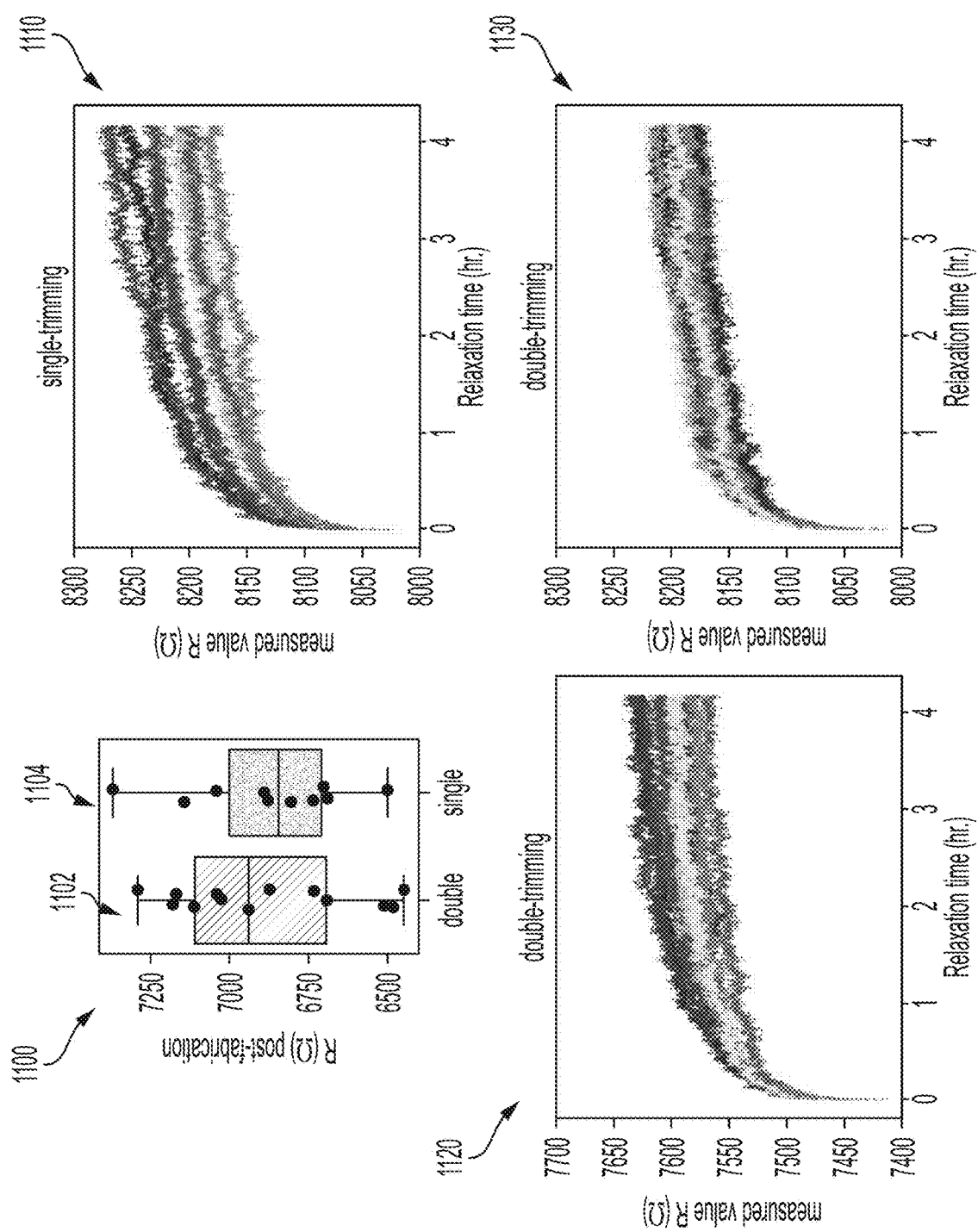
FIG. 11 includes plots showing measured resistance values in ohm before and after performing a single-stage voltage-assisted annealing process and a two-stage voltage-assisted annealing process as a function of aging time in hour.

FIG. 11 includes plots showing measured resistance values in ohm before and after performing a single-stage voltage-assisted annealing process and a two-stage voltage-assisted annealing process as a function of aging time in hour. Two sets of Josephson tunnel junctions of similar initial resistance distribution spread as shown in the plot 1100 are prepared. A first set of tunnel junctions 1102 and a second set of tunnel junctions 1104 having structures shown in FIG. 1 are prepared; and room-temperature junction resistance values are measured using the control system 300, 1200 shown in FIGS. 3 and 12 according to the operations shown in the example process 200 of FIG. 2 are obtained. The first set of tunnel junctions are treated using an alternating-bias assisted annealing process (e.g., the voltage-assisted annealing process 200 in FIG. 2 based on the example voltage waveform 700 shown in FIG. 7A) to a target value of 8000 ohm in a single step (e.g., single-trimming); and the resistance values during the aging process (~4 hours) after the target value is achieved are then monitored and shown in plot 1110. The second set of tunnel junctions are annealed to the same target value of 8000 ohm in two separate steps (e.g., double-trimming): in the first step, the second set of tunnel junctions are treated using an alternating-bias assisted annealing process (e.g., the voltage-assisted annealing process 200 in FIG. 2 based on the example voltage waveform 700 shown in FIG. 7A) to an intermediate target value of 7400 ohm; and the junction resistance during the aging process in following 4 hours are monitored and shown in plot 1120. The second set of tunnel junctions are further treated in a second step, during which the tunnel junctions are treated to the target value of 8000 ohm using an alternating-bias assisted annealing process (e.g., the voltage-assisted annealing process 200 in FIG. 2 based on the example voltage waveform 700 shown in FIG. 7A; and the room-temperature junction resistance during the aging process in the following 4 hours are monitored and shown in plot 1130.

As shown in FIG. 11, the aging variation spread (1-sigma~10 ohm) of the second set of tunnel junctions which are treated using the two-stage voltage-assisted annealing process is significantly lower than that of the aging variation spread (1-sigma~24 ohm) of the first set of tunnel junctions which are treated using the single-stage voltage-assisted annealing process. The two-stage voltage-assisted annealing process can reduce the aging variation spread by a factor of >2. The systems and techniques presented here can improve tunnel junction tuning precision and accuracy. The two-stage voltage-assisted annealing process can be used to suppress the aging variation in junction resistance after the voltage assisted annealing.

Figure 12A:
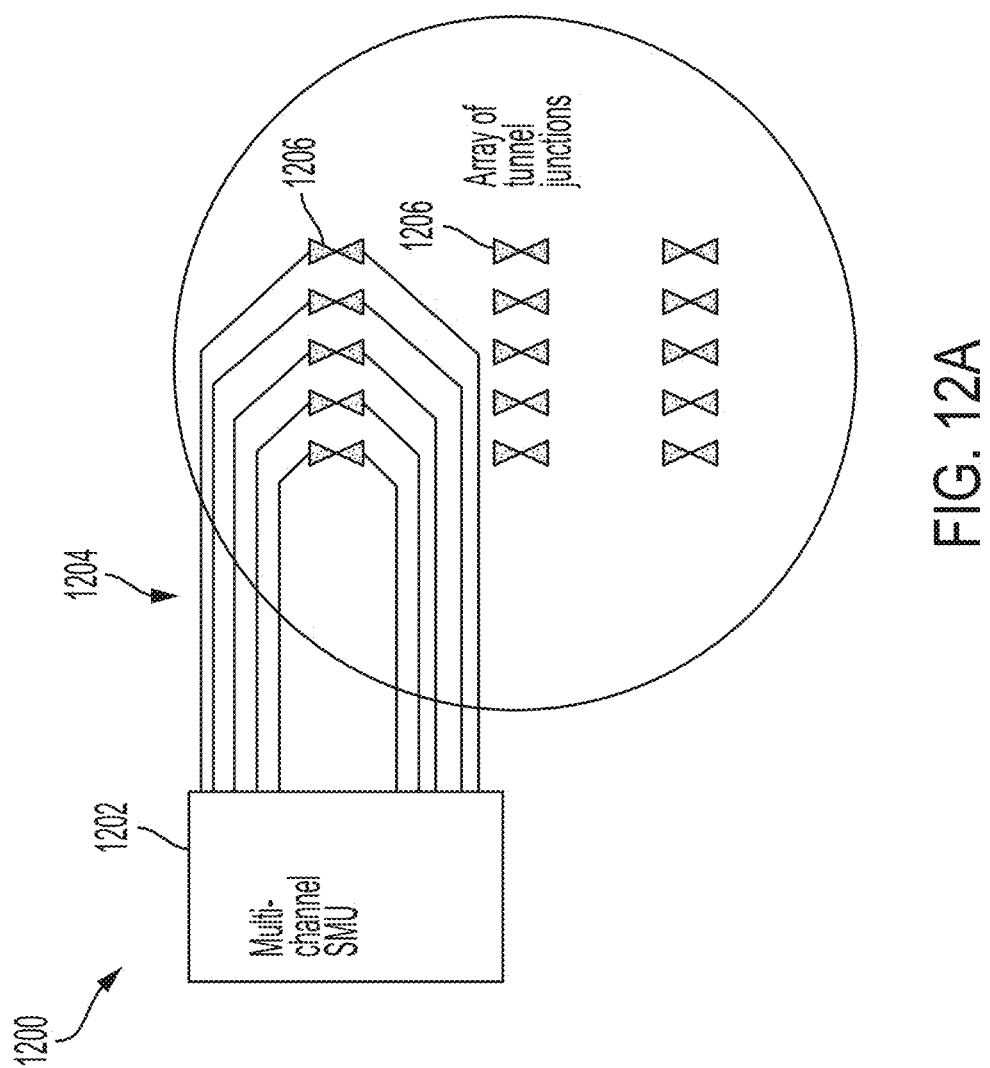
FIG. 12A is a schematic diagram showing an example system for performing voltage-assisted annealing processes on multiple tunnel junctions in parallel.

FIG. 12A is a schematic diagram showing aspects of an example system 1200 configured to perform voltage-assisted annealing on an array of multiple tunnel junctions. In some implementations, the example system 1200 is configured to perform voltage-assisted annealing on multiple tunnel junctions in parallel. The example system 1200 is configured to measure and tune resistance values of the tunnel junctions simultaneously. In some instances, the example system 1200 can be configured to measure and tune properties of devices that are fabricated on the same substrate. In certain instances, the example system 1200 can be configured to measure and tune properties of devices that are supported on different dies, chips or modules.

As shown in FIG. 12A, the example setup 1200 includes a multi-channel source measurement unit (SMU) 1202 and multiple pairs of electrical probes 1204 connected to the multi-channel SMU 1202. The electrical probes 1204 are configured to make electrical contact with at least a subset of the tunnel junctions 1206 in the array. In some instances, the multiple pairs of electrical probes 1204 may be part of a probe-card or another multi-probe system for performing multiple probe measurements. In some instances, the probe card may be implemented as the example probe card 1210 shown in FIGS. 12B-12C with cantilever probes. In some instances, the example probe card 1210 may be implemented as a microelectromechanical system (MEMS) probe card, a needle probe card, or another type of probe card. In some instances, the multiple voltage-assisted annealing processes on multiple tunnel junctions can be performed at room temperature or an elevated or reduced temperature and in an ambient environment or a controlled environment such as nitrogen or under vacuum. In some instances, the example system 1200 includes a controller which can be implemented as the controller 302 in the control system 300 shown in FIG. 3. The controller includes computation apparatus, a memory unit, an input/output interface, or other components which can be configured to select and update parameters of one or more voltage waveforms; determine optimized voltage-assisted annealing processes for respective tunnel junctions; and schedule the voltage waveforms to be applied to the tunnel junctions. In some instances, the controller may be configured to perform other functions.

In some instances, the controller includes a memory unit which can be configured to store one or more preconfigured programs, each of which, when executed, can cause the example system 1200 to perform a voltage-assisted annealing process (e.g., the voltage-assisted annealing process 200 shown in FIG. 2). In certain examples, the one or more pre-configured programs in the memory unit of the controller may be customized or configured based on respective initial values of the junction resistance of the as-fabricated devices, respective target values of the junction resistance, and other parameters. In some instances, the preconfigured program can be dynamically updated according to a response of a tunnel junction to a voltage-assisted annealing process. For example, the annealing voltage, period, number of cycles, aging time, etc. can be determined and dynamically adjusted during the execution of the voltage-assisted annealing process.

In some instances, when multiple voltage-assisted annealing processes are performed on multiple tunnel junctions using the example system 1200 in parallel, the multiple annealing processes may not be synchronized. For example, respective voltage-assisted annealing processes when performed in parallel on distinct tunnel junctions may have different durations; may start at different times and/or terminate at different times. In some instances, when an annealing voltage pulse is applied on a first tunnel junction, a measurement voltage pulse may be applied on a second tunnel junction. In some instances, the multiple voltage-assisted annealing processes may be performed on multiple tunnel junctions in another manner.

Figure 12B:
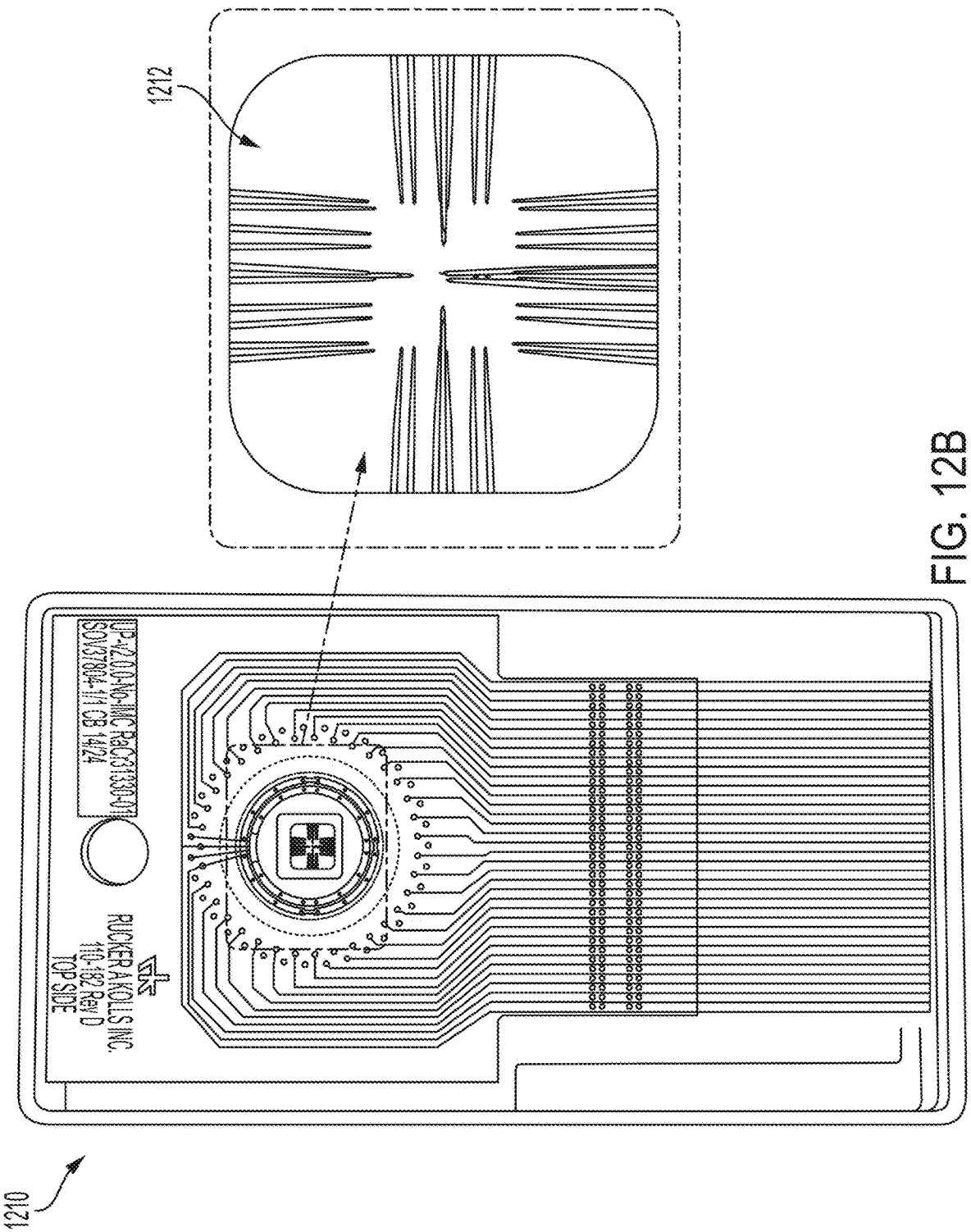
FIGS. 12B-12C include images of an example probe card and electrical probes of the example probe card in contact with multiple tunnel junctions.
Figure 12C:
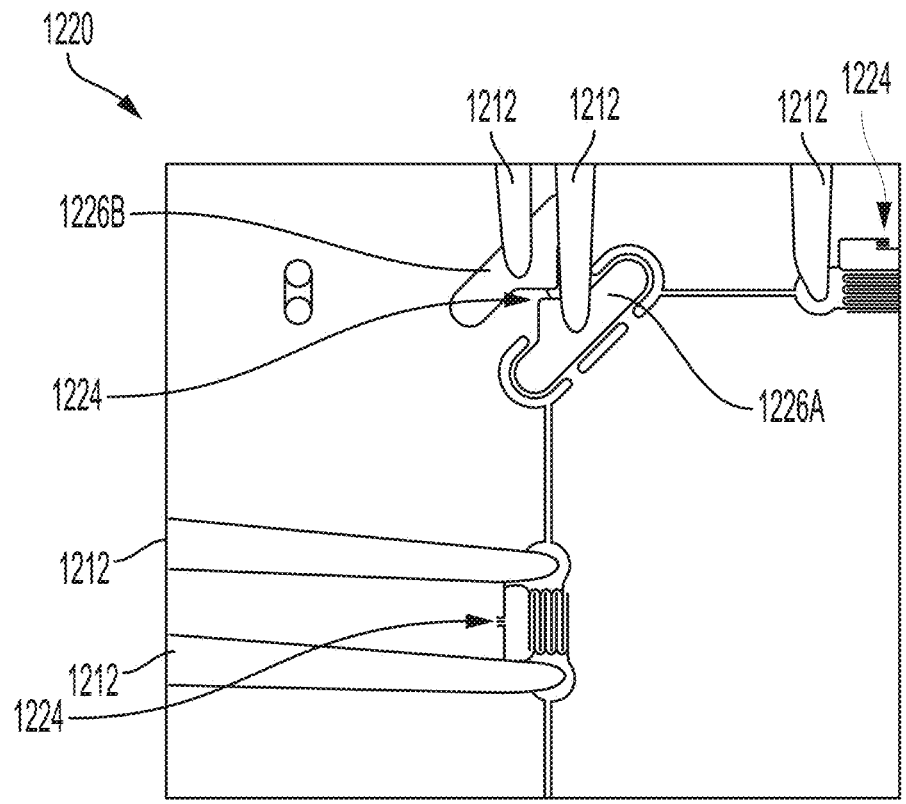

FIGS. 12B-12C include images 1210, 1220 showing an example probe card and electrical probes of the example probe card in contact with multiple tunnel junctions. In some instances, the multiple tunnel junctions 1224 may reside on distinct substrates, dies, or chips. In some instances, the electrical probes of the probe card 1210 may be positioned in a different manner. As shown in FIG. 12B, the example probe card 1210, manufactured by Rucker & Kolls, includes multiple pairs of cantilever probes 1212. Each pair of probes is configured to make electrical contacts with a respective pair of contact pads 1226A/1226B of a respective tunnel junction 1224. Each cantilever probe 1212 is electrically connected to a conductive trace on a printed circuit board of the probe card 1210. In some instances, the positions of the cantilever probes 1212 in the probe card 1210 may be configured to match the layout of the contact pads 1226A/1226B of the tunnel junctions 1224 on the substrate.

Each pair of cantilever probes 1212 is connected to a respective channel of the multi-channel SMU 1202, allowing the voltage and current to be set and measured for each tunnel junction 1224. The multi-channel SMU 1202 is commercially available and may be implemented, for example, using National Instruments PXIe-4163, which has 24 individually controllable SMUs in a single card. When each tunnel junction reaches its target value, which may be different from those of other tunnel junctions 1224 being tuned at the same time, the channel of the multi-channel SMU 1202 connected to that tunnel junction 1224 can be deactivated (e.g., setting voltage levels to zero Volts output) to terminate the annealing process. Once all the tunnel junctions have reached their respective target resistance values, the probe card 1210 can be moved to the next position on the same substrate or a different substrate to perform annealing on other tunnel junctions.

Figure 13A:
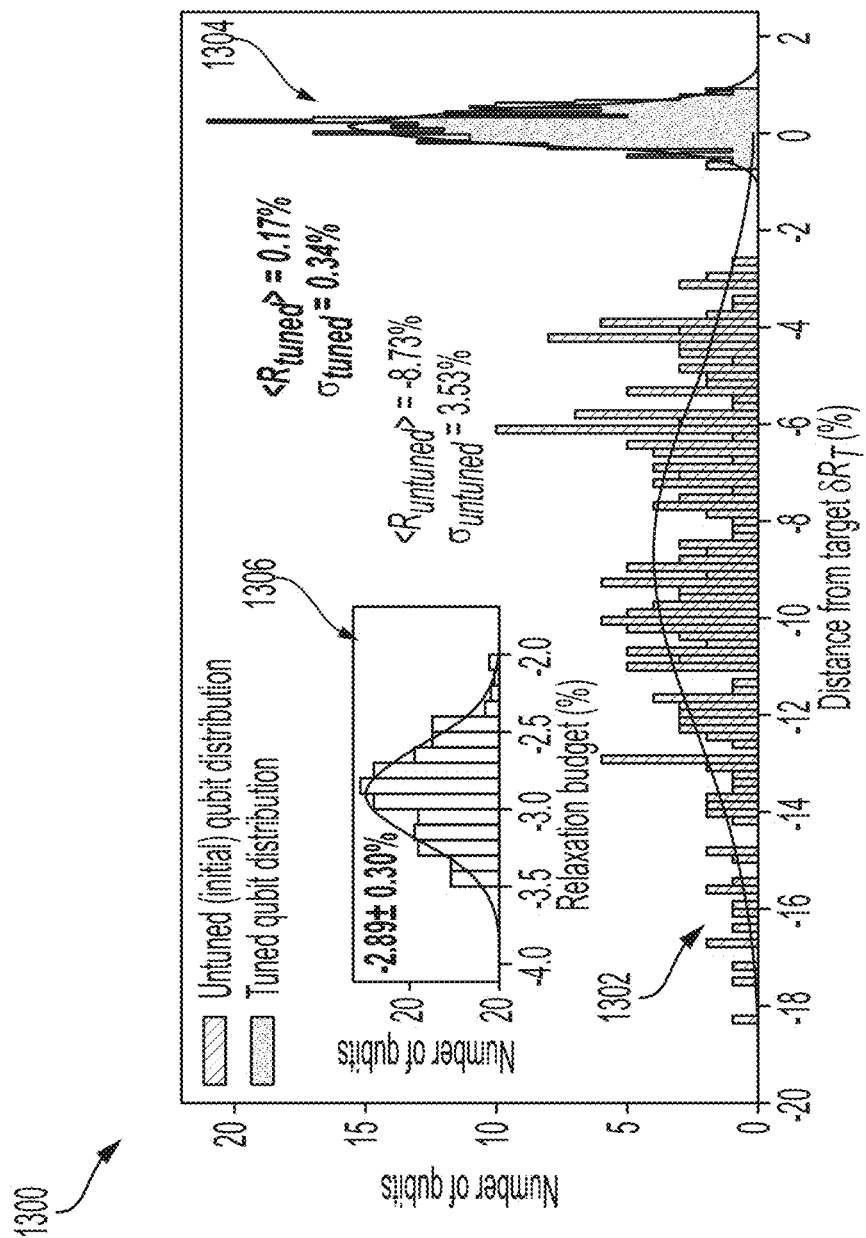
FIG. 13A is a plot showing number of qubits as a function of the distance between initial values and target values of junction resistances of qubit devices in percentage with and without voltage-assisted annealing.

FIG. 13A is a plot 1300 showing number of qubits as a function of the distance between initial values and target values of junction resistances of qubit devices in percentage with and without voltage-assisted annealing. The distance values on the X-axis are normalized to the target value. The target value of the junction resistance is determined based on designed Hamiltonians. A total number of 221 qubit devices are annealed using an alternating-bias assisted annealing process (e.g., the voltage-assisted annealing process 200 based on the example voltage waveform 700 as shown in FIGS. 2 and 7A). The target values of the junction resistance ($R_T$) is set to 98% of their design values, reserving a pre-cooldown aging budget of 2%.

As shown in FIG. 13A, the initial values of junction resistance measured on as-fabricated qubit devices have a first distribution 1302 with an average 8.7% below the target value of the junction resistance with a spread (1-σ) of 3.5%. The initial values of the junction resistance are intentional under-targeting in fabrication in order to use the voltage-assisted annealing process to increase the junction resistance to the target values. After voltage-assisted annealing, the measured values of the junction resistance of the qubit devices are approximately normally distributed as shown in a second distribution 1304 with a mean value of 0.17% above the target value and a spread (1-σ) of 0.34%, showing a ~10-fold reduction in spread from the first distribution 1302 of the initial values from the post-fabricated qubit devices. As shown in FIG. 13A, a tuning range of up to 18.5% can be achieved which is sufficient to cover the typical range of qubit fabrication variations.

In some instances, a pre-calibrated percentage for junction aging and determine the target value upon which to stop the voltage waveform. FIG. 13A also includes a third distribution 1306 of the measured values of the junction resistance $R_a$ at the last annealing voltage pulse with respect to $R_{tuned}$, which corresponds to the aging percentage experienced by the qubit devices after the last annealing voltage pulse till when the target value of the junction resistance is obtained. This third distribution 1306 in $R_a$ effectively represents a calibration data to guide the annealing process, for example, when to turn off the voltage waveform and to allow the junction resistance to evolve through aging to the target value RT. As shown in FIG. 13A, the aging process carries the resistance by an average distance of 2.89% with a standard deviation of 0.30% before reaching $R_{tuned}$, with no appreciable dependence on the total amount of the voltage-assisted annealing process and the initial or final values of the junction resistance. In some instances, the junction-dependent aging behavior may be an important or a dominant factor to resistance tuning imprecision.

Figure 13B:
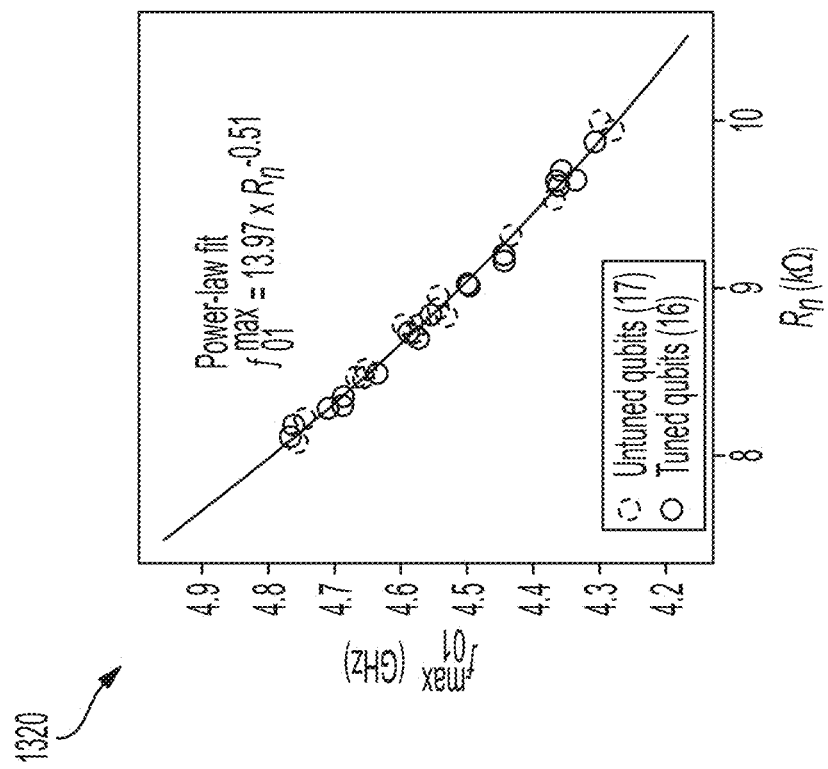
FIG. 13B is a plot showing the $f_{01}^{max}$ in GHz measured at cryogenic temperatures as a function of measured values of room-temperature junction resistance on two separate sets of tunable-frequency qubit devices with and without voltage-assisted annealing.

FIG. 13B is a plot 1320 showing the $f_{01}^{max}$ in GHz measured at cryogenic temperatures as a function of measured values of room-temperature junction resistance on two separate sets of tunable-frequency qubit devices with and without voltage-assisted annealing. In some implementations, the resistance tuning precision characterized at room temperature is used to determine its equivalent frequency tuning precision of $f_{01}^{max}$ at cryogenic temperatures. $f_{01}^{max}$ values of the tunable-frequency qubit devices are measured; and the frequency prediction relation is extracted using an empirical power law fit. As shown in FIG. 13B, both sets of tunable-frequency transmon qubit devices fit well to a single power-law curve, indicating no appreciable impact from the voltage-assisted annealing process on the frequency prediction used for determining target values of the junction resistance. The fitted exponent is ~0.51, in good agreement with the 0.5 exponent expected from the transmon theory and Ambegaokar-Baratoff relation. The standard deviation of the fitting residues is 12.4 MHz, representing an empirical frequency prediction imprecision that includes potential variations in the superconducting gap as well as resistance deviations arising from additional pre-cooldown processes, such as chip cleaning and packaging. Combining the resistance tuning precision (0.34%) from FIG. 13A and the empirical power law fit from FIG. 13B, the frequency tuning precision $\sigma_f$ of 7.7 MHz can be determined based on the resistance tuning precision, e.g., $\sigma_f = \delta f_{01}^{max}/\delta R \cdot \sigma_R = 7.7$ MHz (0.17% of the predicted mean frequency 4556 MHz).

Aside from precision frequency tuning to the designed Hamiltonian patterns, maintaining high coherence and desired tunability range is essential for achieving high 2-qubit gate fidelity. The coherence comparison using a coherence test vehicle chip design where qubits are coupled to frequency-multiplexed feedlines through readout resonators without tunable couplers in between nearest neighbor qubit devices. Qubit relaxation time $T_1$, qubit Ramsey decoherence time $T_2^*$, and qubit pure dephasing time $T_\phi$ while parking at $f_{01}^{max}$ are measured on a first set of transmon qubit devices as-fabricated and a second set of transmon qubit devices from the same wafer after performing an alternating-bias assisted annealing process (e.g., the voltage-assisted annealing process 200 based on the example waveform 700 shown in FIG. 7A).

Figure 14:
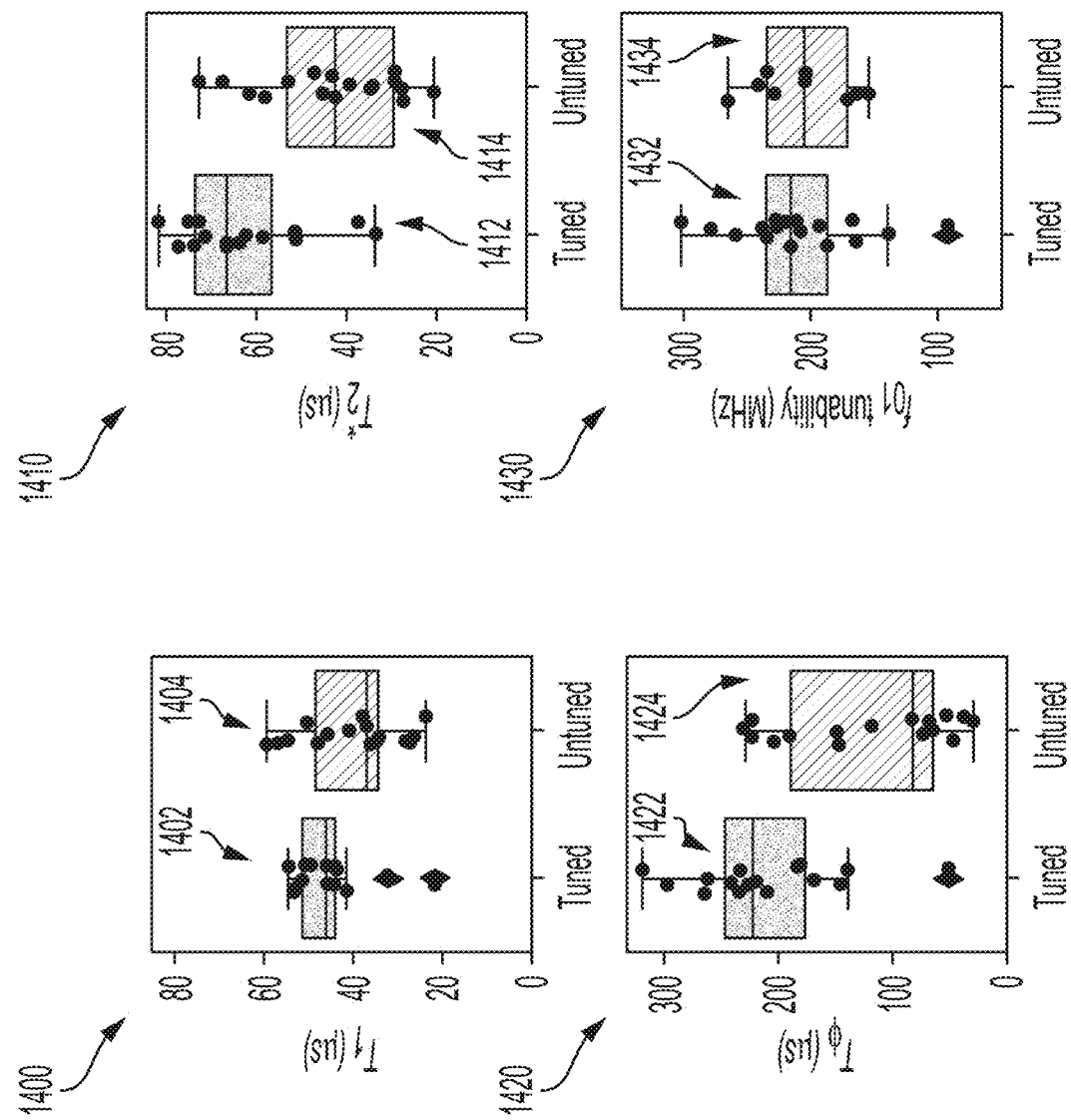
FIG. 14 includes box plots showing properties of qubit devices as fabricated and treated using voltage-assisted annealing.

FIG. 14 includes box plots comparing properties of qubit devices as fabricated and treated using voltage-assisted annealing. Each qubit device includes a superconducting transmon qubit device. In some implementations, a superconducting transmon device, as described in the publication "Charge insensitive qubit design derived from the cooper pair box," by Koch et al., Phys. Rev. A 76, 042319 (2007) which is incorporated herein by reference, includes a tunnel junction in parallel with a capacitor such that the junction and capacitance energies, $E_J$ and $E_C$, conform to specifications in order to set the frequency of about $\sqrt{8E_J E_C}$, anharmonicity of about $E_C$, and charge noise of about $E_J/E_C$ such that the device can be used as a quantum circuit device. In some instances, these parameters are on the order of 5 GHZ, 100 MHz, and 50 MHz when normalized by Planck's constant $\hbar$. The superconducting transmon qubit devices with nominally identical tunability designs are fabricated on the same wafer. As shown in FIG. 14, plot 1400 shows qubit relaxation time $T_1$, plot 1402 shows qubit Ramsey decoherence time $T_2^*$, plot 1420 shows qubit pure dephasing time $T_\phi$; and plot 1430 shows qubit tunability ($f_{01}$ tunability). All coherence data points were measured at $f_{01}^{max}$. The tunability ($f_{01}^{max} - f_{01}^{min}$) is calculated from measured $f_{01}^{max}$ and $f_{01}^{min}$ values at each qubit device.

As shown in FIG. 14, while the improvement in Ramsey decoherence time $T_2^*$ in plot 1410 and qubit pure dephasing time $T_\phi$ in plot 1420 is statistically significant, the improvement in qubit relaxation time $T_1$ in plot 1400 is less obvious within the error range. As shown in FIG. 14, the voltage-assisted annealing process can result in higher median coherence values across all three coherence indicators. The frequency normalized loss tangent $(1/(T_1 \cdot 2\pi f_{01}^{max}))$ can be calculated, and a reduction in median loss from 9.8e-7 on the first set of transmon qubit devices to 7.4e-7 on the second set of transmon qubit devices is observed, which is consistent with the loss reduction described in the publication "Alternating bias assisted annealing of amorphous oxide tunnel junctions," by Pappas et al. arXiv:2401.07415 [phyics.app-ph], 2024, which is incorporated here by reference.

The tunability variations in the first set of transmon qubit devices are dominated by fabrication variation of Josephson junctions in the first set of transmon qubit devices. The difference in tunability between the first and second sets of transmon qubit devices shown in plot 1430 is statistically insignificant within the statistical error of fabrication variation. This result serves as an empirical demonstration that, within an integrated process flow, the voltage-assisted annealing process introduces no statistically significant change in tunability.

The systems and techniques presented here can be used in an integrated workflow for improving detuning edge yield and achieving high two-qubit gate fidelity on full lattices. Tunable-frequency qubit devices on a set of quantum processor chips are tuned targeting the designed Hamiltonian frequency. The tunable-frequency qubit devices on each quantum processor chip are arranged in a 3×3 square lattice with a tunable-frequency coupler device between each pair of neighboring tunable-frequency qubit devices.

Figure 15A:
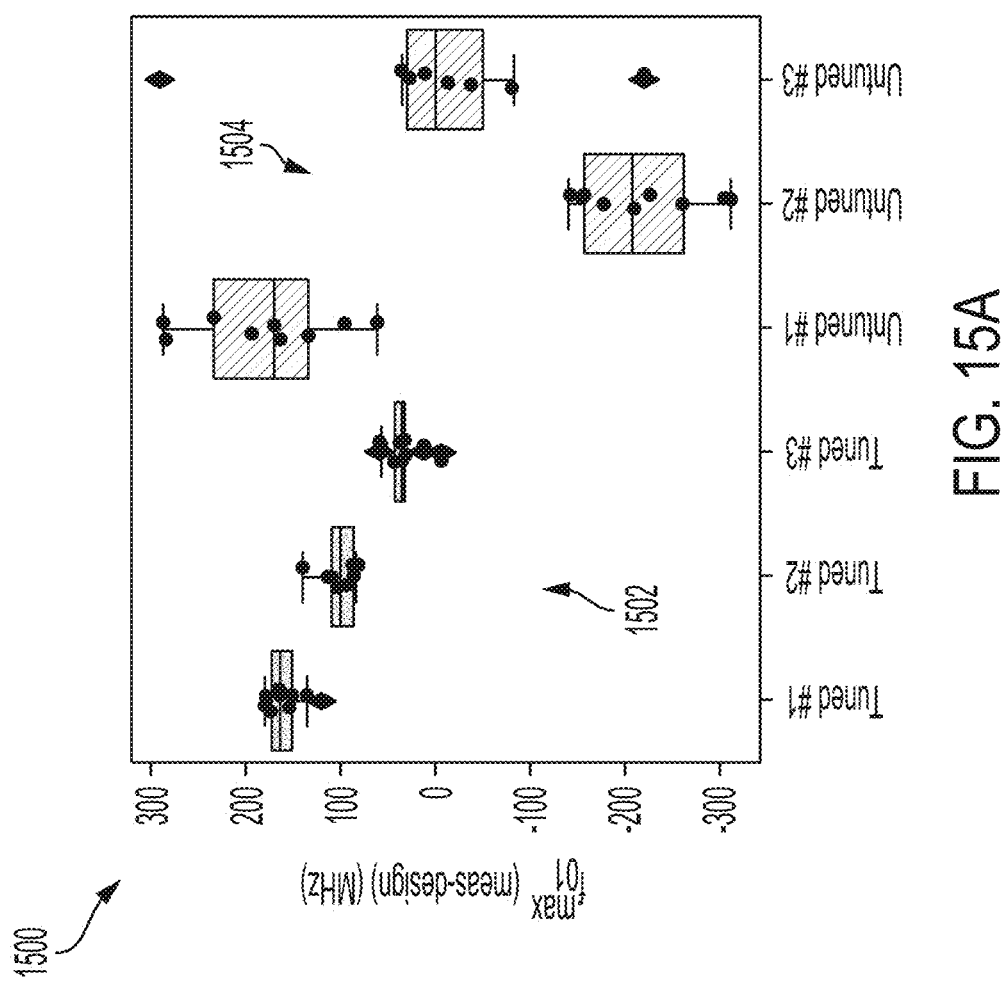
FIG. 15A is a box plot showing the detuning precision (e.g., the distance from the measured values to the design values of $f_{01}^{max}$) in MHz for quantum processor chips as fabricated and treated using voltage-assisted annealing.

FIG. 15A is a box plot 1500 showing the detuning precision (e.g., the distance from the measured values to the design values of $f_{01}^{max}$) in MHz for quantum processor chips as fabricated and treated using voltage-assisted annealing. As shown in FIG. 15A, a typical measurement uncertainty in $f_{01}^{max}$ of ~4 MHz can be observed due to variations in flux bias conditions at adjacent tunable-frequency coupler devices when operating within normal parameter regimes. Despite chip-specific global offsets that are common on both of the two sets of quantum processor chips with and without performing the voltage-assisted annealing process, the second set of quantum processor chips 1502 exhibits a significant reduction in frequency spread compared to the first set of as-fabricated quantum processor chips 1504. The chip-level global offset observed on the second set of quantum processor chips may be caused by a combination of effects. For example, an operational mismatch between the reserved aging budget for tuning targeting and the actual aging amount until the start of the cooldown, offset in target resistance assignment due to a systematic error in empirical frequency prediction or other effect may cause the chip-level global offset.

Figure 15B:
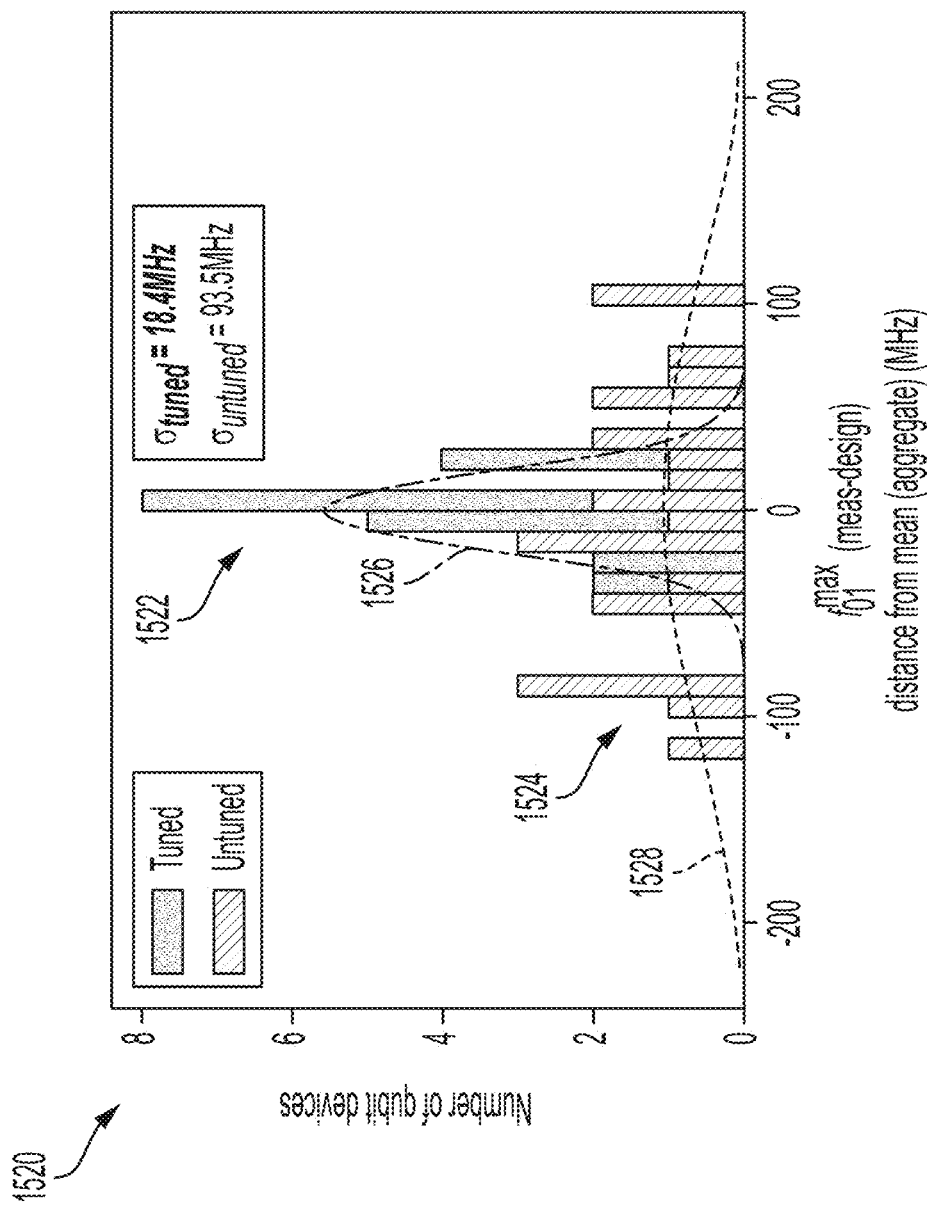
FIG. 15B is a plot showing the number of qubit devices as a function of the detuning precision (e.g., the distance from the measured values to the design values of $f_{01}^{max}$) in MHz for quantum processor chips as fabricated and treated using voltage-assisted annealing.

FIG. 15B is a plot 1520 showing the number of qubit devices as a function of the detuning precision (e.g., the distance from the measured values to the design values of $f_{01}^{max}$) in MHz for quantum processor chips as fabricated and treated using voltage-assisted annealing. The detuning precision is determined by subtracting the global offset on each quantum processor chip. The bin size is 10 MHz. Dashed lines 1526, 1528 are Gaussian fits to the first and second distributions 1522, 1524. The distributions outlined by Gaussian fit give a standard deviation of 18.4 MHz on the second set of quantum processor chips treated using voltage-assisted annealing and 93.5 MHz on the first set of quantum processor chips as fabricated, corresponding to 0.40% and 2.02% of the average design frequency (4628 MHz). The appearance of symmetric frequency distribution after performing the voltage-assisted annealing process also indicates that the spread is independent of the voltage-assisted annealing process and the time elapsed after performing the annealing process.

In some instances, two-qubit quantum logic gate (e.g., iSWAP) fidelity on quantum processor chips treated by performing the voltage-assisted annealing process with design Hamiltonians optimized for the two-qubit quantum logic gates can be evaluated. To minimize the impact of flux noise on the dephasing time of the modulated qubit, qubit frequencies are designed such that the nearest neighbor qubit-qubit detuning is centered around ~50 MHz. This ensures the modulated qubit devices can have less frequency excursion from its maximum frequency to bring it into resonance with its neighboring qubit devices. In addition, the Hamiltonian is designed to make the qubit-qubit detunings large enough that the residual ZZ interaction is minimal at zero-coupling bias.

Figure 16A:
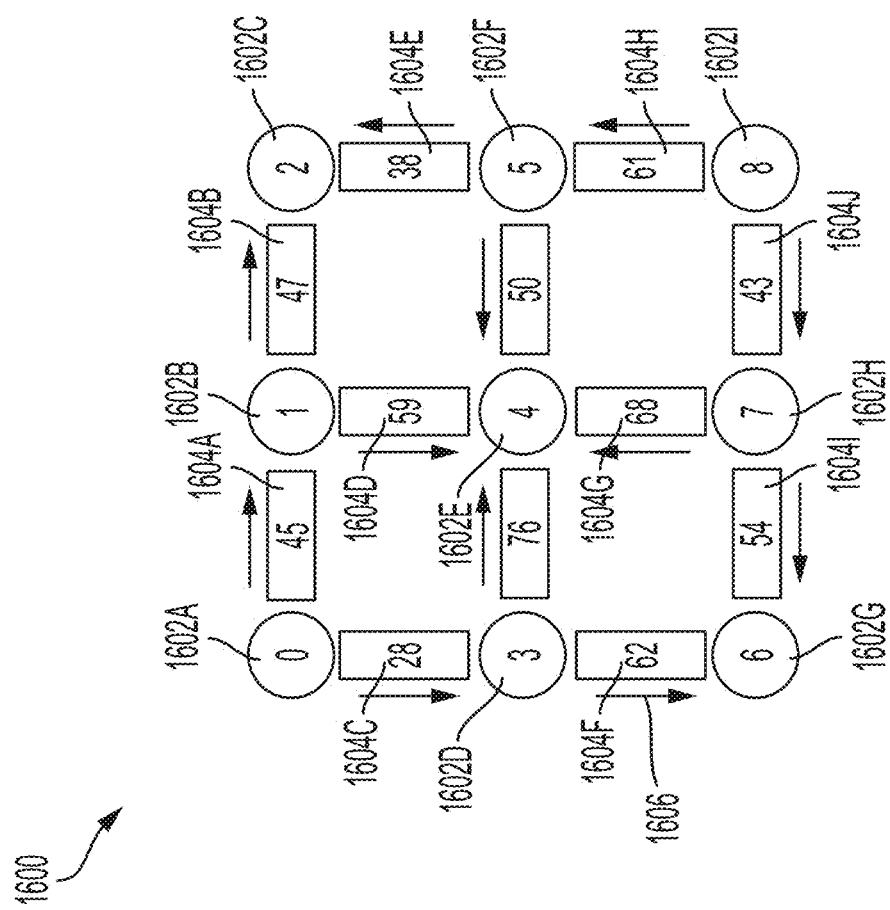
FIG. 16A is a schematic diagram showing design values of qubit-qubit detunings between neighboring qubit devices in an as-fabricated quantum processor chip without voltage-assisted annealing.
Figure 16B:
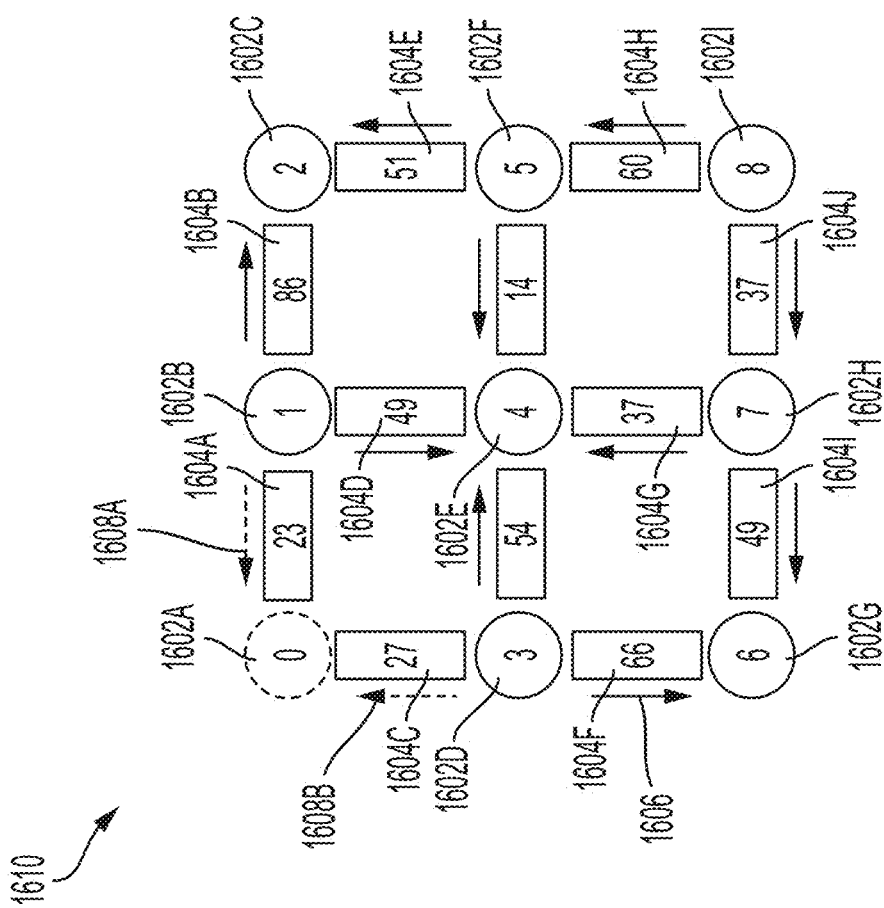
FIG. 16B is a schematic diagram showing measured values of qubit-qubit detunings between neighboring qubit devices in a quantum processor chip after performing the voltage-assisted annealing process.

FIG. 16A is a schematic diagram 1600 showing design values of qubit-qubit detunings between neighboring qubit devices in an as-fabricated quantum processor chips [tuned #3 in the first set of quantum processor chips 1502 of FIG. 15A] without voltage-assisted annealing. Designed values of the qubit-qubit frequency detunings are in a range of 20-80 MHz, with a median qubit-qubit detuning of 50.5 MHz. Arrows 1606 indicate which qubit device's frequency is modulated among two neighboring qubits in resonance to activate an iSWAP gate. Only qubit device 1602A is parked off of $f_{01}^{max}$ (by −27 MHz) to arrive at the detunings shown in FIG. 16B, where detunings at all edges fall within the desired small detuning range. The arrows 1606 show the directions of the modulated qubits being moved to enact the iSWAP gate. For example, qubit device 1602D has a higher frequency than qubit devices 1602E, 1602G and thus iSWAP gates are activated by moving the frequency of the qubit device 1602D down to bring it in resonance with qubit devices 1602E, 1602G. As shown in FIG. 16B, the directions of the gate operations on two edges as indicated by arrows 1608A and 1608B are changed relative to the respective directions of the gate operations shown in FIG. 16A. The qubit frequencies are allocated such that there are no more than two edges (or gates) activated by applying the frequency modulation signals on the same tunable-frequency qubit device. This minimizes the number of frequency collisions between neighboring qubit devices during gate operation.

FIG. 16B is a schematic diagram 1610 showing measured values of qubit-qubit detunings between neighboring qubit devices in a quantum processor chip after performing the voltage-assisted annealing process. Parametric resonance two-qubit iSWAP gates described in the publication by Sete at al., "Parametric-resonance entangling gates with a tunable coupler", Phys. Rev. Appl. 16, 024050, 2021, which is incorporated here by reference, are characterized on each edge of the quantum processor chips. Parametric resonance gates are activated by modulating the frequency of the higher-frequency qubits to bring the qubits into resonance. A different quantum processor chip from the second set is characterized in which two qubits off of $f_{01}^{max}$ are moved to avoid frequency collisions and measured qubit-qubit detunings with a median of 48 MHz, which is very close to the design qubit-qubit detuning.

In some implementations, the qubit-qubit detunings are measured when the coupler flux bias applied on the tunable-frequency coupler devices is parked at a value that results in a zero coupling strength e.g., g=0. As shown in FIG. 16B, the qubit-qubit detunings at all edges are within the desired small detuning range and a median detuning of 49 MHz is obtained and used for two-qubit gate characterization in FIG. 16C. Only one qubit (qubit device 1602A) needs to be parked off of $f_{01}^{max}$ (by −27 MHz) to arrive at the desired frequency configuration shown in FIG. 16B, highlighting the excellent frequency allocation after the annealing process Without parking any qubit off of its $f_{01}^{max}$, the difference between the measured and designed detunings is on average −10.8±22.5 MHz across the lattice, which is consistent with the statistical detuning error of ±26.0 MHz that is expected from the measured single-qubit frequency tuning precision of 18.4 MHz.

FIG. 16C is a schematic diagram 1620 showing the iSWAP interleaved randomized benchmarking (iRB) fidelity between neighboring qubit devices in the quantum processor chip under the detuning conditions shown in FIG. 16B. The iSWAP gates on each edge of the quantum processor chip are characterized and their performance is benchmarked with iRB according to the method described in the publication by Magesan et al, "Efficient measurement of quantum gate error by interleaved randomized benchmarking", Phys. Rev. Lett. 109, 080505, 2012, which is incorporated here by reference. As shown in FIG. 16C, the tunable-frequency coupler devices 1604 reaching iRB fidelity as high as 99.51±0.20%, and median iRB fidelity of 99.00% on the quantum processor chip with 9-qubit devices. The median iSWAP gate time is 68 ns including a total of 16 ns padding before and after the flux pulse. Specifically, the iSWAP iRB fidelity between qubit devices 1602A, 1062B is 99.51%; the iSWAP iRB fidelity between qubit devices 1602B, 1062C is 98.91%; the iSWAP iRB fidelity between qubit devices 1602D, 1062E is 99.13%; the iSWAP iRB fidelity between qubit devices 1602E, 1062F is 98.41%; the iSWAP iRB fidelity between qubit devices 1602G, 1062H is 98.17%; the iSWAP iRB fidelity between qubit devices 1602H, 10621 is 99.09%; the iSWAP iRB fidelity between qubit devices 1602A, 1062D is 99.35%; the iSWAP iRB fidelity between qubit devices 1602B, 1062E is 99.23%; the iSWAP iRB fidelity between qubit devices 1602C, 1062F is 98.50%; the iSWAP iRB fidelity between qubit devices 1602D, 1062G is 98.81%; the iSWAP iRB fidelity between qubit devices 1602E, 1062H is 98.08%; and the iSWAP iRB fidelity between qubit devices 1602F, 10621 is 99.11%.

Figure 17A:
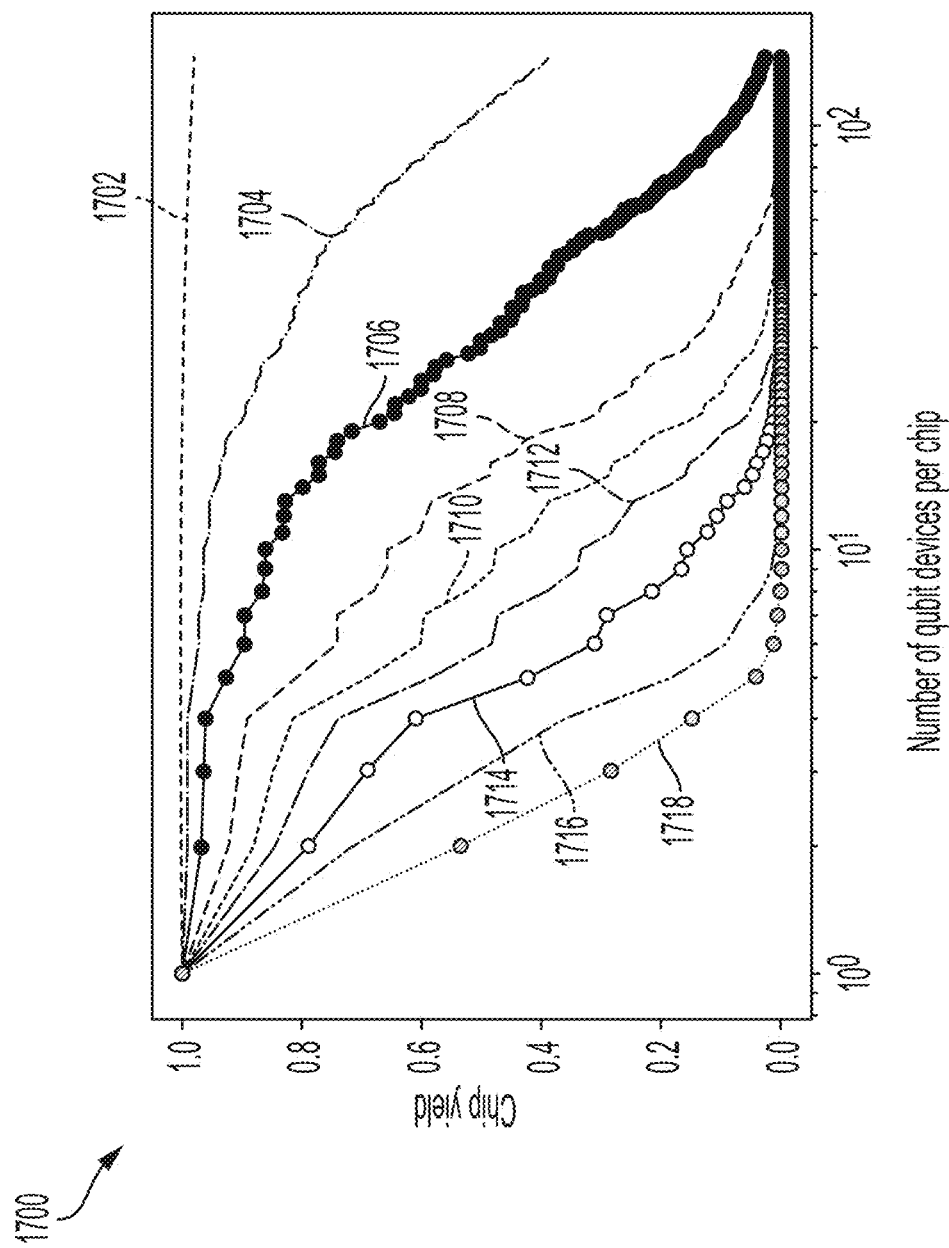
FIG. 17A is a plot showing a simulated chip yield as a function of the number of qubit devices on a quantum processor chip over a range of frequency tuning precision in MHz from a voltage-assisted annealing process.
Figure 17B:
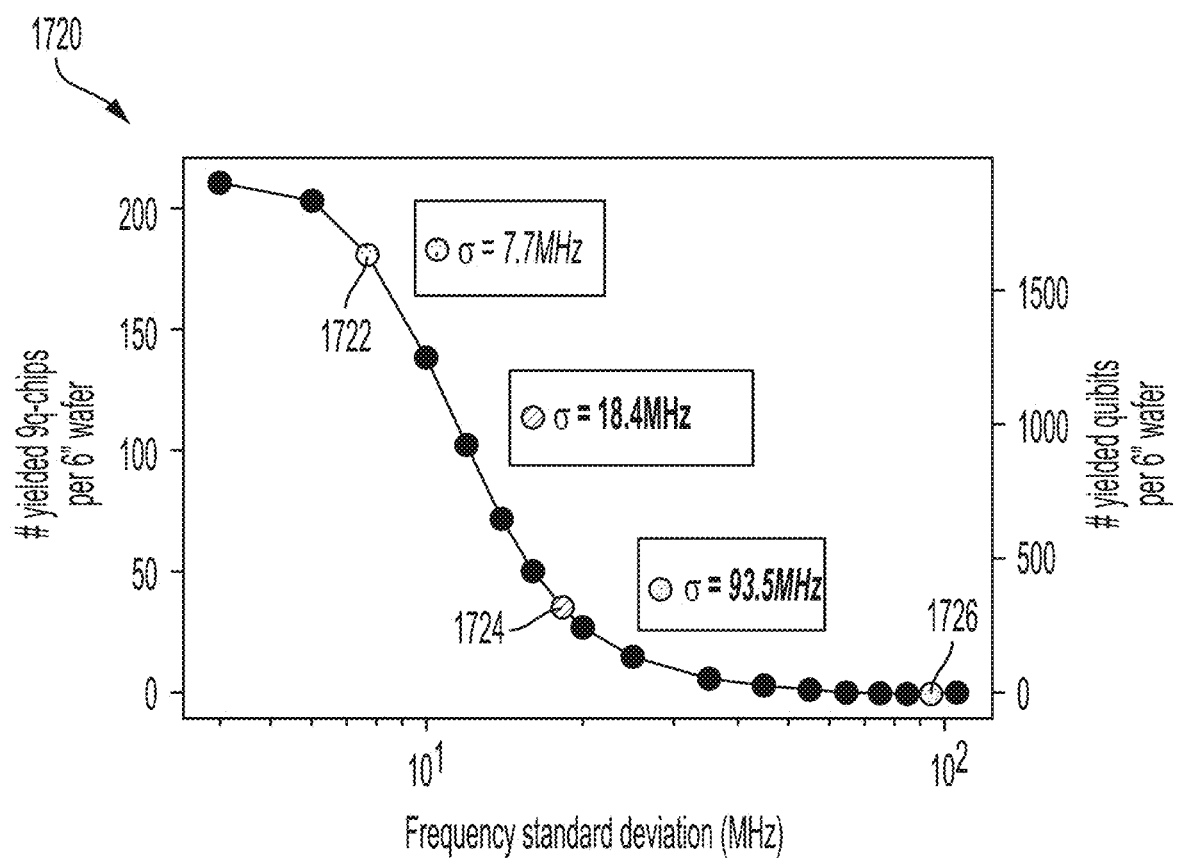
FIG. 17B is a plot showing the number of yielded 9-qubit quantum processor chips and the number of yielded qubit devices per six-inch wafer as a function of frequency tuning precision in MHz from a voltage-assisted annealing process.

FIG. 17A shows the simulated chip yield as a function of the number of qubit devices on the quantum processor chip, over a range of frequency tuning precision, e.g., 4 MHz (curve 1702), 6 MHz (curve 1704), 7.7 MHz (curve 1706), 10 MHz (curve 1708), 12 MHz (curve 1710), 14 MHz (curve 1712), 18.4 MHz (curve 1714), 45 MHz (curve 1716), and 93.5 MHz (curve 1718). FIG. 17B assumes a layout of 212 dice of 9-qubit quantum processor chips on a 6-inch wafer and plots the predicted number of yielded 9-qubit quantum processor chips (left y-axis) and the corresponding number of yielded qubits (right y-axis) per wafer as a function of frequency tuning precision. The simulation is applied to a scalable Hamiltonian with edge (qubit-qubit) $f_{01}^{max}$ detunings designed in the 40-110 MHz range and the yield is defined as the probability of all nearest neighbor 2-qubit edges at $f_{01}^{max}$ falling in the 20-130 MHz detuning range (e.g., desired for high-fidelity iSWAP gates). Here the Hamiltonian is constructed by tiling a 9-qubit (3×3 lattice) unit-cell design that ensures detunings fall within the 40-110 MHz range within the 9-qubit lattice as well as along stitching edges, allowing 20 MHz buffer zones from the yield boundaries on both ends. This Hamiltonian is scalable because it enables up-scaling quantum processors by stitching yielded 9-qubit chips via inter-module coupler devices described in publications "Modular superconducting qubit architecture with a multi-chip tunable coupler," by Field et al., arXiv:2308.09240, 2023 and "Entanglement across separate silicon dies in a modular superconducting qubit device," by Gold et al., npj Quantum Information 7, 142, 2021, which are incorporated here by reference.

The three curves 1706, 1714, 1718 in FIG. 17A and the three data points 1722, 1724, 1726 in FIG. 17B correspond to the relevant tuning precisions demonstrated in this study. As shown in FIGS. 17A-17B, with the frequency spread of 93.5 MHz on as-fabricated devices, it is virtually impossible to yield any chip beyond the few-qubit chip scale. The number of yielded 9-qubit chips per wafer is approximately zero. With the empirical frequency tuning precision of 18.4 MHz demonstrated using the voltage-assisted annealing process in an integrated process flow, there is an about 17% chance for a 9-qubit chip to meet the detuning range while parking at $f_{01}^{max}$. This corresponds to yielding approximately 35 tileable 9-qubit quantum processor chips (315 yielded qubits total) per 6-inch wafer. With the frequency-equivalent resistance tuning precision of 7.7 MHz from the voltage-assisted annealing process, a 9-qubit quantum processor chip yield of 86% can be achieved, which corresponds to yielding 182 tileable 9-qubit quantum processor chips per 6 inch wafer, sufficient for tiling into a scaled-up quantum processor of over 1500 qubits. The chip yield at 7.7 MHz frequency spread (curve 1706 in FIG. 17A) does not drop to zero till surpassing the 100-qubit chip scale, indicating possibilities of yielding monolithic chips of 100-qubit. The systems and techniques presented here can be used as a viable post-fabrication frequency tuning technique for achieving high detuning-edge yield beyond the 1000-qubit scale on modular superconducting quantum processors.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media.

Some of the operations described in this specification can be implemented as operations performed by a data processing apparatus on data stored on one or more computer-readable storage devices or received from other sources.

In a general aspect, a method for altering junction properties of a tunnel junction using voltage-assisted annealing is presented.

In a first example, a method includes modifying a room-temperature junction resistance of a tunnel junction by applying a voltage across the tunnel junction which includes a metal and a metal oxide.

Implementations of the first example may include one or more of the following features. The method includes modifying the room-temperature junction resistance of the tunnel junction by applying a voltage across the tunnel junction while controlling a temperature of the tunnel junction. Controlling the temperature of the tunnel junction includes heating the tunnel junction to a target annealing temperature. The tunnel junction includes a pair of electrodes and a barrier layer between the pair of electrodes, and the method includes applying a voltage waveform across the pair of electrodes. The metal is made of aluminum, and the metal oxide includes amorphous aluminum oxide.

Implementations of the first example may include one or more of the following features. Applying the voltage includes applying a voltage waveform which includes an annealing pulse with a first amplitude; and a measurement pulse with a second amplitude that is less than the first amplitude. Applying the voltage includes applying a voltage waveform comprising a sequence of annealing pulses and measurement pulses. Each of the measurement pulses is applied between a respective pair of the annealing pulses in the sequence. Each of the annealing pulses has the same voltage amplitude. The annealing pulses have alternating polarities in the sequence.

Implementations of the first example may include one or more of the following features. The method includes measuring a junction resistance of the tunnel junction to obtain a measured value of the junction resistance; and in response to the measured value meeting a predetermined condition, terminating the application of the voltage waveform. The method includes determining a target value of the junction resistance based on predetermined calibration data; comparing the measured value with the target value; and terminating application of the voltage waveform in response to determining that the measured value is within a predetermined range of the target value. The method includes after terminating application of the voltage waveform, allowing the tunnel junction to age over an aging period. The voltage waveform is a first voltage waveform, and the method includes after allowing the tunnel junction to age over the aging period, applying a second voltage waveform to the tunnel junction.

Implementations of the first example may include one or more of the following features. The tunnel junction is a first tunnel junction in a circuit, the voltage waveform is a first voltage waveform, and the method includes applying a second, distinct voltage waveform on a second tunnel junction while applying the first voltage waveform on the first tunnel junction. The tunnel junction is a first tunnel junction, and the method includes applying the voltage waveform on a second tunnel junction in a circuit while applying the voltage waveform on the first tunnel junction.

In a second example, a method of performing a tuning process to modify a junction resistance of a tunnel junction includes obtaining a fabricated circuit including the tunnel junction; applying, to the circuit, a voltage that modifies the junction resistance of the tunnel junction; and after applying the voltage, measuring the junction resistance of the tunnel junction.

Implementations of the second example may include one or more of the following features. The method includes terminating the tuning process in response to a measured value of the junction resistance meeting a predetermined condition. The method includes iteratively applying annealing pulses and measurement pulses to the tunnel junction. The annealing pulses modify the junction resistance, and the measurement pulses measure the junction resistance.

Implementations of the second example may include one or more of the following features. The method includes applying the voltage across the tunnel junction before the circuit is deployed for operation; and comparing the measured value with a target value of the junction resistance, wherein the target value is associated with operation of the circuit. The method includes terminating the tuning process in response to determining that the measured value is within a predetermined range of the target value. The target value of the junction resistance is associated with a room-temperature junction resistance of the tunnel junction, and the target value is calculated based on a superconducting critical current of the tunnel junction at a cryogenic temperature according to the Ambegaokar-Baratoff formula. The target value is calculated based on the superconducting critical current and is adjusted based on calibration data.

Implementations of the second example may include one or more of the following features. The tunnel junction includes a pair of electrodes and a barrier layer between the pair of electrodes, and the method includes applying a voltage waveform across the pair of electrodes. The metal is aluminum, and the metal oxide includes amorphous aluminum oxide. Applying the voltage to the circuit includes applying a voltage waveform which includes an annealing pulse with a first amplitude; and a measurement pulse with a second amplitude that is less than the first amplitude. The first amplitude of the annealing pulses is less than a breakdown voltage of the tunnel junction and preserves functionality of the tunnel junction.

Implementations of the second example may include one or more of the following features. Applying the voltage to the circuit includes applying a voltage waveform comprising a sequence of annealing pulses and measurement pulses. Each of the measurement pulses is applied between a respective pair of the annealing pulses in the sequence. Each of the annealing pulses has the same voltage amplitude. The annealing pulses have alternating polarities in the sequence. The method includes applying the voltage waveform while holding the tunnel junction at a target annealing temperature. The target annealing temperature is room temperature. The target annealing temperature is greater than room temperature. The target annealing temperature is in a range of 0 and 673 Kelvin.

In a third example, a system includes a source measurement unit; and a controller communicably coupled to the source measurement unit, the controller configured to cause the source measurement unit to modify a junction resistance of a tunnel junction by applying a voltage across the tunnel junction; and measure the junction resistance of the tunnel junction.

Implementations of the third example may include one or more of the following features. The system includes a temperature control element configured to control a temperature of the tunnel junction while the junction resistance is modified. The controller is configured to operate the temperature control element to heat the tunnel junction to a target annealing temperature. The tunnel junction includes a pair of electrodes and a barrier layer between the pair of electrodes, and the controller is configured to cause the source measurement unit to apply a voltage waveform across the pair of electrodes. The tunnel junction includes a metal and a metal oxide, the metal includes aluminum, and the metal oxide includes amorphous aluminum oxide.

Implementations of the third example may include one or more of the following features. The controller is configured to cause the source measurement unit to apply a voltage waveform to the tunnel junction. The voltage waveform includes an annealing pulse with a first amplitude; and a measurement pulse with a second amplitude that is less than the first amplitude. Applying the voltage includes applying a voltage waveform which includes a sequence of annealing pulses and measurement pulses. Each of the measurement pulses is applied between a respective pair of the annealing pulses in the sequence. Each of the annealing pulses has the same voltage amplitude. The annealing pulses have alternating polarities in the sequence.

Implementations of the third example may include one or more of the following features. The controller is configured to cause the source measurement unit to measure a junction resistance of the tunnel junction to obtain a measured value of the junction resistance; compare the measured value of the junction resistance to a target value; and in response to a difference between the measured value and the target value being less than a threshold, terminate the application of the voltage waveform. The voltage waveform is a first voltage waveform, and the controller is configured to cause the source measurement unit to allow the tunnel junction to age over an aging period after terminating application of the first voltage waveform; and apply a second voltage waveform to the tunnel junction after allowing the tunnel junction to age over the aging period.

Implementations of the third example may include one or more of the following features. The tunnel junction is a first tunnel junction, the voltage waveform is a first voltage waveform, and the controller is configured to cause the source measurement unit to modify a junction resistance of a second tunnel junction by applying a second, distinct voltage waveform on a second tunnel junction while applying the first voltage waveform on the first tunnel junction. The tunnel junction is a first tunnel junction, and the controller is configured to cause the source measurement unit to modify a junction resistance of a second tunnel junction by applying the voltage waveform on the second tunnel junction while applying the voltage waveform on the first tunnel junction.

In a fourth example, a system includes a source measurement unit, and a controller communicably connected to the source measurement unit. The controller is configured to cause the source measurement unit to modify a junction resistance of the tunnel junction by applying a voltage across the tunnel junction; obtain a measured value of the junction resistance of the tunnel junction from the source measurement unit; and compare the measured value with a target value.

Implementations of the fourth example may include one or more of the following features. The controller is configured to terminate a tuning process based on a result of comparing the measured value with the target value. The target value of the junction resistance is associated with a room-temperature junction resistance of the tunnel junction, and the controller is configured to calculate the target value based on a superconducting critical current of the tunnel junction at a cryogenic temperature according to the Ambegaokar-Baratoff formula.

Implementations of the fourth example may include one or more of the following features. The tunnel junction includes a pair of electrodes and a barrier layer between the pair of electrodes, and the controller is configured to cause the source measurement unit to apply a voltage waveform across the pair of electrodes. The electrodes include aluminum, and the barrier layer includes amorphous aluminum oxide.

Implementations of the fourth example may include one or more of the following features. Applying the voltage across the tunnel junction includes applying a voltage waveform which includes an annealing pulse with a first amplitude; and a measurement pulse with a second amplitude that is less than the first amplitude. The first amplitude of the annealing pulses is less than a breakdown voltage of the tunnel junction and preserves functionality of the tunnel junction.

Implementations of the fourth example may include one or more of the following features. Causing the source measurement unit to apply the voltage across the tunnel junction includes causing the source measurement unit to apply a voltage waveform which includes a sequence of annealing pulses and measurement pulses. Each of the measurement pulses is applied between a respective pair of the annealing pulses in the sequence. Each of the annealing pulses has the same voltage amplitude. The annealing pulses have alternating polarities in the sequence. The controller is configured to cause the source measurement unit to apply the voltage waveform while the tunnel junction is held at a target annealing temperature. The target annealing temperature is room temperature. The system includes a temperature control unit configured to hold the tunnel junction at the target annealing temperature. The target annealing temperature is greater than room temperature. The target annealing temperature is in a range of 0 and 673 Kelvin.

In a fifth example, a method includes obtaining a circuit comprising tunnel junctions; and tuning junction resistances of respective tunnel junctions. Tuning the junction resistances includes applying voltage waveforms to the respective tunnel junctions. Each of the voltage waveforms includes a sequence of pulses. The method further includes obtaining measured values of the junction resistances; and comparing the measured values with target values.

Implementations of the fifth example may include one or more of the following features. The voltage waveforms are applied to the respective tunnel junctions in parallel. Obtaining the circuit includes obtaining a chip which includes the plurality of tunnel junctions on the same substrate. The target values include distinct target values for the respective tunnel junctions, and tuning the junction resistances includes tuning the junction resistance of each tunnel junction based on the respective target value for the tunnel junction. A quantum processor chip includes quantum circuit devices, the quantum circuit devices include the tunnel junctions. Tuning the junction resistances includes tuning transition frequencies of the quantum circuit devices. The transition frequencies of the quantum circuit devices are associated with their operation in a cryogenic environment. A quantum processor chip includes qubit devices, the qubit devices comprise the tunnel junctions. Tuning the junction resistances increases coherence times of the qubit devices. The coherence times of the respective qubit devices are associated with their operation in a cryogenic environment.

In a sixth example, a multi-probe system includes a probe card, a source measurement unit communicably coupled to the probe card, and a controller communicably coupled to the source measurement unit. The probe card includes electrical probes configured to communicate electrical signals to tunnel junctions in a circuit. The controller is configured to cause the source measurement unit to modify junction resistances of the tunnel junctions by applying voltage waveforms to the respective tunnel junctions through the electrical probes.

Implementations of the fifth example may include one or more of the following features. The electrical probes are arranged to contact pads associated with multiple tunnel junctions on the same substrate. The source measurement unit is configured to measure the junction resistances of the tunnel junctions by applying measurement pulses to the respective tunnel junctions. The source measurement unit is a multi-channel source measurement unit configured to apply the voltage waveforms to the respective tunnel junctions through multiple channels. A quantum processor chip includes quantum circuit devices. The quantum circuit devices include the tunnel junctions. Modifying the room-temperature junction resistances of the tunnel junctions modifies transition frequencies of the respective quantum circuit devices. The transition frequencies of the respective quantum circuit devices are associated with their operation in a cryogenic environment. A quantum processor chip includes qubit devices. The qubit devices include the tunnel junctions. Modifying the room-temperature junction resistances of the tunnel junctions increases coherence times of the respective qubit devices. The coherence times of the respective qubit devices are associated with their operation in a cryogenic environment.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple implementations separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A method comprising:
    obtaining a substrate comprising a tunnel junction; and
    performing an alternating-bias assisted annealing process on the tunnel junction, comprising applying a sequence of annealing pulses with alternating polarities and measurement pulses on the tunnel junction,
    wherein the alternating-bias assisted annealing process changes one or more properties of the tunnel junction, the one or more properties including the superconducting critical current of the tunnel junction at a cryogenic temperature.

2. The method of claim 1, wherein the tunnel junction comprises a pair of electrodes and a barrier layer between the pair of electrodes, and performing the alternating-bias assisted annealing process comprises applying the sequence of annealing pulses and measurement pulses across the pair of electrodes.

3. The method of claim 2, wherein the tunnel junction comprises a metal and a metal oxide, the metal is made of aluminum, and the metal oxide comprises amorphous aluminum oxide.

4. The method of claim 2, wherein performing the alternating-bias assisted annealing process comprises:
    performing the alternating-bias assisted annealing process at room temperature.

5. The method of claim 1, wherein:
    each annealing pulse in the sequence has a first voltage amplitude; and
    each measurement pulse in the sequence has a second voltage amplitude that is less than the first voltage amplitude.

6. The method of claim 5, wherein the alternating-bias assisted annealing process is performed at room temperature, and wherein the first voltage amplitude is less than a breakdown voltage of the tunnel junction and preserves functionality of the tunnel junction.

7. The method of claim 1, wherein performing the alternating-bias assisted annealing process comprises:
    measuring a junction resistance of the tunnel junction to obtain a measured value of the junction resistance;
    comparing the measured value of the junction resistance to a target value; and
    based on the comparison, terminating the alternating-bias assisted annealing process.

8. The method of claim 7, wherein the target value is associated with a room-temperature junction resistance of the tunnel junction, and the target value is calculated based on a target superconducting critical current of the tunnel junction at a cryogenic temperature according to the Ambegaokar-Baratoff formula.

9. The method of claim 1, wherein the tunnel junction is a first tunnel junction, the substrate comprises a plurality of tunnel junctions including the first tunnel junction, and the method comprises performing the alternating-bias assisted annealing process on the plurality of tunnel junctions.

10. The method of claim 9, wherein the alternating-bias assisted annealing process is applied to the respective tunnel junctions in parallel.

11. The method of claim 9, wherein the substrate comprises a plurality of qubit devices, and applying the alternating-bias assisted annealing process comprises tuning transition frequencies of the plurality of qubit devices.

12. The method of claim 9, wherein the alternating-bias assisted annealing process increases respective coherence times of the qubit devices.

13. The method of claim 9, wherein performing the alternating-bias assisted annealing process on the plurality of tunnel junctions comprises tuning the one or more properties of the plurality of tunnel junctions.

14. The method of claim 9, wherein the superconducting critical currents of the plurality of tunnel junctions at a cryogenic temperature are tuned to respective values by the alternating-bias assisted annealing process.

15. The method of claim 1, wherein each of the measurement pulses in the sequence is applied between a respective pair of the annealing pulses in the sequence.

16. The method of claim 1, wherein the annealing pulses have distinct voltage amplitudes.

* * * * *